United States Patent
Shinohara et al.

(10) Patent No.: US 7,145,180 B2
(45) Date of Patent: Dec. 5, 2006

(54) METHOD OF FABRICATING A LIGHT EMITTING DEVICE, AND LIGHT EMITTING DEVICE

(75) Inventors: Masayuki Shinohara, Annaka (JP); Masato Yamada, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 71 days.

(21) Appl. No.: 10/627,892

(22) Filed: Jul. 28, 2003

(65) Prior Publication Data

US 2004/0023426 A1  Feb. 5, 2004

(30) Foreign Application Priority Data

Jul. 31, 2002 (JP) ............................. 2002-223134
May 15, 2003 (JP) ............................. 2003-137052

(51) Int. Cl.
*H01L 31/12* (2006.01)

(52) U.S. Cl. .................. 257/85; 257/13; 257/51; 257/97; 257/E33.021; 257/E33.025; 257/E33.027; 257/E33.032

(58) Field of Classification Search .............. 257/12, 257/13, 51, 85, 97, 189, 200, 96, 91, 101, 257/102, E33.021, E33.025, E33.027, E33.032
See application file for complete search history.

(56) References Cited

U.S. PATENT DOCUMENTS

| 5,233,204 | A | | 8/1993 | Fletcher et al. |
| 5,442,203 | A | | 8/1995 | Adomi et al. |
| 5,488,233 | A | * | 1/1996 | Ishikawa et al. ............... 257/94 |
| 6,569,765 | B1 | * | 5/2003 | Solomon et al. ............ 438/680 |
| 2005/0110041 | A1 | * | 5/2005 | Boutros et al. .............. 257/192 |

FOREIGN PATENT DOCUMENTS

| JP | 51-144185 | 12/1976 |
| JP | 5-275740 | 10/1993 |
| JP | 5275740 | 10/1993 |
| JP | 7-66455 | 3/1995 |

* cited by examiner

*Primary Examiner*—George Fourson
*Assistant Examiner*—Julio J. Maldonado
(74) *Attorney, Agent, or Firm*—Snider & Associates; Ronald R. Snider

(57) ABSTRACT

In the fabricating of a light emitting device, a light emitting layer portion 24 and a current spreading layer 7, respectively composed of a Group III-V compound semiconductor, are stacked on a single crystal substrate. The light emitting layer portion 24 is formed by a metal organic vapor-phase epitaxy process, and the current spreading layer 7, on such light emitting layer portion 24, is formed to have conductivity type of n-type by a hydride vapor-phase epitaxy process.

4 Claims, 13 Drawing Sheets

METHOD OF FABRICATING A LIGHT EMITTING DEVICE, AND LIGHT EMITTING DEVICE

RELATED APPLICATION

This application claims the priorities of Japanese Patent Application No. 2002-223134 filed on Jul. 31, 2002 and 2003-137052 filed on May 15, 2003.

BACKGROUND OF THE INVENTION

1. Field of the Invention

The invention relates to a method of fabricating a light emitting device, and a light emitting device; in particular to a method of fabricating a light emitting device, and a light emitting device, which is suitable for the light emitting device performed the extraction of emitted light from an n-type semiconductor layer side.

2. Description of the Related Art

Light emitting devices having the light emitting layer portion thereof composed of $(Al_xGa_{1-x})_yIn_{1-y}P$ (where, $0 \leq x \leq 1$ and $0 \leq y \leq 1$, referred to AlGaInP alloy, or more simply AlGaInP, hereinafter) alloy can achieve a high luminance by adopting a double heterostructure in which a thin AlGaInP active layer is sandwiched between an n-type AlGaInP cladding layer and a p-type AlGaInP cladding layer which have a larger band gap. As for these devices, either the n-type AlGaInP cladding layer side or the p-extracting the emitted light obtained at the light emitting layer portion. It is to be noted that the object of the invention is the light emitting device which is extracted the light emitted at the light emitting layer portion from an n-type semiconductor layer side. According to this note, the emitted light is extracted from the n-type AlGaInP cladding layer side.

Referring now to AlGaInP light emitting device, a p-type GaAs buffer layer, a p-type AlGaInP cladding layer, an AlGaInP active layer, and an n-type AlGaInP cladding layer are stacked in this order on a p-type GaAs substrate, to thereby form a light emitting layer portion having a double heterostructure. Current supply to the light emitting layer portion is generally accomplished via a metal electrode formed on the surface of the device. Since the metal electrode functions as a light interceptor, it is typically formed so as to cover only the center portion of the main surface of the light emitting layer portion, so that the light can be extracted from the peripheral area having no electrode formed thereon.

In this case, reduction in the area of the metal electrode is advantageous in ensuring a larger light leakage area formed around the electrode, and in improving the light extraction efficiency. Although a number of efforts have been made to increase the amount of extractable light by effectively spreading current within the device based on various designs of the electrode shape, any of them could not exempt from increase in the electrode area, and fell in a dilemma that consequent reduction in the light leakage area undesirably limits the amount of light extraction. Another problem resides in that carrier concentration of the dopant, that is conductivity, is generally suppressed at a slightly lower level in order to optimize light emitting recombination of the carriers within the active layer, and this makes the current less likely to spread in the in-plane direction. This means undesirable concentration of current density into the area covered with the electrode, and reduction in substantial amount of extractable light from the light leakage area. A general method for solving this problem is to dispose a current spreading layer having a raised carrier concentration, and consequently having a low resistivity, between the cladding layer and electrode. On the other hand, another possible constitution relates to that a thick current spreading layer is disposed on the back side of the device so that the layer is used also as the substrate (while the current spreading layer in this case may be assumed as a conductive substrate, it is to be defined in the specification that the layer conceptually belongs to the current spreading layer in a broad sense). In most conventional cases, such current spreading layer has been formed by a metal organic vapor-phase epitaxy process (also occasionally referred to as a MOVPE process) together with the light emitting layer portion.

The current spreading layer provided in the light emitting device is generally designed so as to increase the thickness thereof to some extent in order to sufficiently spread the current in the in-plane direction, and typically formed with a larger thickness than the light emitting layer portion has. A MOVPE process, however, is slow in the layer growth rate, needs considerably long time for growing the current spreading layer to a sufficient thickness, and thus raises problems in degraded production efficiency and increased costs. Organo-metallic compounds used as Group III element sources in a MOVPE process are generally expensive. Moreover, it is necessary in a MOVPE process to use Group V element sources (e.g., $AsH_3$, $PH_3$) in a great excess (10 to several hundred times) of Group III element sources in order to improve the crystallinity, and this raises another disadvantage from the viewpoint of costs.

The current spreading layers grown by a MOVPE process are likely to contain residual H (hydrogen) and C (carbon) derived from the organo-metallic molecules. For the case where the current spreading layer is designed to have a conductivity type of n-type by doping with Si (Silicon), S (Sulfur), Se (Selenium) or Te (Tellurium), the residual C contributes as p-type dopant, so that a relatively large amount of Si (Silicon), S (Sulfur), Se (Selenium) or Te(Tellurium) of n-type dopant must be added in order to ensure a sufficient conductivity required for the current spreading layer. Addition of such the n-type dopant in a large amount will, however, raise the problems below.

The light emitting devices lower their luminance as the current supply thereto is prolonged. Assuming now that the emission luminance measured immediately after the start of current supply to the device at a constant current is defined as the initial luminance, and the emission luminance which decreases with the elapse of cumulative current supply time is traced. In this case, a time required for the emission luminance to reach a predetermined limit luminance, or a ratio of emission luminance after the elapse of evaluation current supply time with respect to the initial luminance (referred to as "device life", hereinafter) under a constant evaluation current supply time (e.g., 1,000 hours) can be used as a kind of index for evaluating the device life. Excessive increase in the n-type dopant in the current spreading layer, in particular in a portion adjacent to the light emitting layer portion, tends to accelerate the degradation of the device life.

It is therefore a first subject of the invention to provide a method of fabricating a light emitting device capable of forming the current spreading layer to have conductivity type of n-type in an efficient manner. A second subject resides in providing a light emitting device having an improved device life even if n-type current spreading layer is used.

SUMMARY OF THE INVENTION

To solve the first subject, a method of fabricating a light emitting device according to the invention is such as fabricating a light emitting device in which a light emitting layer portion and a current spreading layer respectively composed of a Group III-V compound semiconductor are once stacked on a single crystal substrate and an electrode for applying light emission drive voltage to the light emitting layer portion is formed, and the method comprises:

a first vapor-phase growth step for forming the light emitting layer portion on the single crystal substrate by a metal organic vapor-phase epitaxy process; and a second vapor-phase growth step, carried out after the first vapor-phase growth step, for forming the current spreading layer as an n-type semiconductor layer based on a hydride vapor-phase epitaxy process which is different from the metal organic vapor-phase epitaxy process.

A first constitution of a light emitting device of the invention has a light emitting layer portion and a current spreading layer, respectively composed of a Group III-V compound semiconductor, once formed on a single crystal substrate by epitaxial growth, wherein:

the light emitting layer portion is formed by a metal organic vapor-phase epitaxy process; and the current spreading layer, on the light emitting layer portion, is formed as an n-type semiconductor layer by a hydride vapor-phase epitaxy process which is different from the metal organic vapor-phase epitaxy process.

In the invention, the current spreading layer is formed as an n-type semiconductor layer by a hydride vapor-phase epitaxy process (referred to as a HVPE process, hereinafter). A HVPE process refers to a method in which less volatile Ga (gallium) is converted into highly volatile GaCl through a reaction with hydrogen chloride, and a Group V element source gas and Ga in a form of GaCl are reacted to allow the Group III-V compound semiconductor layer to grow in the vapor phase. Whereas the layer growth rate in a MOVPE process is approx. 4 μm/hour, that in a HVPE process is as fast as approx. 9 μm/hour. That is, adoption of a HVPE process is successful in obtaining a higher layer growth rate than by a MOVPE process, and even a current spreading layer having a certain level of thickness can be formed very efficiently, so that costs for the source materials can be suppressed by far than in a MOVPE process. A HVPE process is also advantageous from the viewpoint of costs since expensive organo-metallic compounds are not necessary as the Group III element sources, and the Group V element sources (e.g., $AsH_3$, $PH_3$) are necessary only in a mixing ratio to the Group III element sources far smaller than ever (typically ⅓ times or around).

In particular, use of $GaAs_{1-a}P_a$ ($0 \leq a \leq 1$) as a material composing the current spreading layer is advantageous in that the material can readily be grown by a HVPE process, and that it becomes more easier to upgrade quality of the current spreading layer. It is to be noted that $GaAs_{1-a}P_a$ ($0 \leq a \leq 1$) in the invention conceptually includes GaP, because GaP alloy composition "a" may have a value of 1. On the other hand, it conceptually includes also GaAs because GaP alloy composition "a" may have a value of 0, where GaAs has a band gap smaller than that of GaP, and is more likely to cause absorption of flux of light emitted from the light emitting portion 24. It is therefore preferable to set GaP alloy composition "a" larger than 0.

It is characterized in that the current spreading layer in the invention is formed, using one or more selected from the group consisting of Si, S, Se and Te as the dopant, as an n-type $GaAs_{1-a}P_a$ ($0 \leq a \leq 1$) layer having a band gap energy larger than an optical energy corresponded to the peak emission wavelength of the light emitting layer portion. Since the current spreading layer in the invention is formed by a HVPE process, the layer is less causative of residual H or C unlike the layer formed by a MOVPE process. Therefore, even when the current spreading layer is composed of an n-type $GaAs_{1-a}P_a$ ($0 \leq a \leq 1$) layer containing one or more selected from the group consisting of Si, S, Se and Te as the dopant, the amount of residual C as the p-type dopant is suppressed, so that the doping efficiency of these n-type dopant can be effectively improved. This means that the amount of addition of the n-type dopant required for ensuring a necessary level of conductivity can be minimized to a far smaller level as compared with that of the current spreading layer formed by a MOVPE process. Such reduction in the concentration of n-type dopant consequently improves the device life to a large extent. The C concentration of the current spreading layer formed by a HVPE process can typically be suppressed to as low as $7 \times 10^{17}/cm^3$ or lower, and it is even relatively easy to reduce it below the detection limit (e.g., approx. $1 \times 10^{17}/cm^3$ or lower). In other words, the C concentration in a portion of the current spreading layer formed by a HVPE process can be suppressed to $7 \times 10^{17}/cm^3$ or lower. As for the current spreading layer composed of an n-type $GaAs_{1-a}P_a$ ($0 \leq a \leq 1$) layer containing one or more selected from the group consisting of Si, S, Se and Te as the dopant, it is preferable to select the GaP alloy composition "a" so that the band gap energy thereof is larger than an optical energy corresponded to the peak emission wavelength of the light emitting layer portion, in order to suppress the light absorption and to improve the light extraction efficiency.

The carrier concentration of one or more selected from the group consisting of Si, S, Se and Te as the n-type dopant in the current spreading layer can be set within a range from $1 \times 10^{17}/cm^3$ to $5 \times 10^{19}/cm^3$ for example. The carrier concentration of n-type dopant in the current spreading layer less than $1 \times 10^{17}/cm^3$ may be unsuccessful in obtaining a sufficient conductivity and current spreading effect, and exceeding $5 \times 10^{19}/cm^3$ may ruin the crystallinity due to alloying.

Because the current spreading layer is grown by a HVPE process by which a large growth rate is attainable in the invention, even the current spreading layer having a thickness of 20 m or above, which is difficult to grow within a practical duration of time by a MOVPE process, can be obtained in a relatively efficient manner. In particular, the current spreading layer grown to as thick as 50 m or above can be used also as the substrate of the device. In this case, the current spreading layer available also as the substrate of the device may be disposed on either of the light extraction side of the light emitting layer portion (where only a part of the main surface of the current spreading layer is covered with the electrode) or the back side.

For the case where the current spreading layer is disposed on the back side, the contact layer is formed so as to partially cover the back side of the current spreading layer having transparency to the light emitted from the light emitting layer portion. It is also allowable, on the back side of the current spreading layer, to cover the contact layer with a metal electrode which is also used as a reflective layer so as to cover the contact layer together with the area having no contact layer formed therein. In this case, the contact layer contributes to lower the contact resistance between the metal electrode and the current spreading layer. On the other hand, it is still also allowable, on the back side of the current spreading layer, to cover the contact layer with a metal paste layer such as an Ag paste layer together with the area having no contact layer formed therein. In either case, reflective effect of flux of light can be raised by the metal electrode or metal paste layer in particular in the area having no contact layer formed therein.

It is to be noted that the current spreading layer having a thickness exceeding 200 m may considerably extend the duration of time for the growth even with a HVPE process, and may ruin the production efficiency. From this point of view, the thickness of the current spreading layer (formed in the second vapor-phase growth step) is preferably set to 200 m or below. Too thin current spreading layer may, however, be unsuccessful in achieving a sufficient current spreading effect to thereby ruin the emission efficiency. It is therefore preferable for the current spreading layer to ensure at least 5 m of the thickness. For the case where the current spreading layer is not used as the substrate of the device, the thickness thereof is preferably limited to less than 50 m while placing a priority to the production efficiency. In particular for the case where the growth temperature is relatively high (e.g., 800° C. or above), the thickness of the current spreading layer is preferably set to less than 50 m, and more preferably to 20 m or below, since no further increase in the emission intensity is expectable even if the thickness of the current spreading layer increases to or beyond 50 m. On the other hand, as described later, selection of an optimum off-angled, single crystal substrate on which the growth proceeds can considerably lower the growth temperature of the current spreading layer in a HVPE process. In this case, increase in the thickness of the current spreading layer may be successful in further increasing the emission intensity, and selection of the thickness of 50 m or above may be valuable.

It is preferable to form a high-concentration doped layer in a surficial area including the main surface on the electrode forming side of the current spreading layer, so as to have a carrier concentration of the dopant for generating majority carriers higher than that in the residual portion of the current spreading layer. By forming such high-concentration doped layer, in-plane spreading effect of the current in the surficial portion of the current spreading layer is improved, and this ensures a sufficient current spreading effect even under a small layer thickness. The concentration of the dopant is not raised over the entire portion of the layer, but instead selectively raised only in a surficial portion, and this is less likely to cause degradation in the device life otherwise possibly caused by an excessive dopant concentration, and also less likely to cause scattering loss of light due to the majority carriers. In particular for the case where the current spreading layer is formed as thin as 20 m or less, provision of the high-concentration doped layer takes a large effect.

An advantage of forming the high-concentration doped layer becomes particularly eminent when the current spreading layer is composed of n-type $GaAs_{1-a}P_a$ ($0 \leq a \leq 1$) as an n-type semiconductor layer. That is, since the current spreading layer is grown by a HVPE process in the invention, only a small amount of the residual C acts as the p-type dopant, so that the amount of addition of one or more selected from the group consisting of Si, S, Se and Te as the n-type dopant can be reduced all along. This successfully ensures a large concentration margin of the n-type dopant under the limit concentration causative of degradation of the device life, and intrinsically reduces influences of the formation of the high-concentration doped layer on the device life or so. It is noted that, for the case where the HVPE layer portion is formed in the current spreading layer by a hydride vapor-phase epitaxy process, the HVPE layer can be formed so that the dopant concentration thereof on the major surface side close to the light emitting layer portion is lower than that in the n-type cladding layer, and such setting of the dopant concentration in the HVPE layer is more advantageous in suppressing degradation of the device life.

More specifically, with regard to the carrier concentration of the dopant in the current spreading layer formed as the n-type semiconductor layer containing one or more selected from the group Si, S, Se and Te as the dopant, the high-concentration doped layer preferably falls within a range from $1 \times 10^{18}/cm^3$ to $5 \times 10^{19}/cm^3$. The carrier concentration of the n-type dopant less than $1 \times 10^{18}/cm^3$ may be less effective in promotion of in-plane current spreading in the high-concentration doped layer, and exceeding $5 \times 10^{19}/cm^3$ may ruin the crystallinity due to alloying. The thickness of the high-concentration doped layer is preferably adjusted within a range from 1 m to 4 m. The thickness less than 1 m may be less effective in promotion of in-plane current spreading, and exceeding 4 m may ruin the crystallinity due to alloying and degrade the device life or emission intensity since ratio of the thickness of the high-concentration doped layer to the total thickness becomes too large.

On the other hand, the carrier concentration of the n-type dopant of the current spreading layer but in a portion other than the high-concentration doped layer preferably falls within a range from $1 \times 10^{17}/cm^3$ to $1 \times 10^{18}/cm^3$. The carrier concentration of the n-type dopant less than $1 \times 10^{17}/cm^3$ may increase series resistance of such portion to thereby lower the emission efficiency. On the other hand, the carrier concentration exceeding $1 \times 10^{18}/cm^3$ may result in diffusion of the n-type dopant in a large amount from such portion towards the light emitting layer portion, to thereby degrade the emission performance. That is, for the case where the current spreading layer is formed, using one or more selected from the group consisting of Si, S, Se and Te as the dopant, as the n-type semiconductor layer, the carrier concentration of the dopant is preferably adjusted within a range from $1 \times 10^{18}/cm^3$ to $5 \times 10^9/cm^3$ for the high-concentration doped layer, and from $1 \times 10^{17}/cm^3$ to $1 \times 10^{18}/cm^3$ for the residual portion.

The current spreading layer composed of GaP, having a relatively wide band gap, is less likely to cause light absorption even when a short-wavelength light is emitted from the light emitting layer portion. Such constitution is advantageous in view of ensuring a necessary light extraction efficiency, and of widening a selectable range of materials for the light emitting layer portion when suppression of light absorption is taken into account.

On the other hand, composing the current spreading layer with $GaAs_{1-a}P_a$, which is an alloy of GaP and GaAs, yields the following advantages. Since the growth temperature of GaAs is lower than that of GaP, it can be successful in efficiently suppressing nonconformities causing the degradation in the emission performance such that the n-type dopant excessively diffuses towards the light emitting layer portion side, or that the distribution of the dopant is altered because of the diffusion of the dopant in the light emitting layer portion, in particular that the dopant diffuses from the cladding layer towards the active layer in a double heterostructure, during the growth of the current spreading layer. It is noted that, when $GaAs_{1-a}P_a$ is used for this purpose, the GaP alloy composition "a" is preferably adjusted within a range from 0.5 to 0.9 so as to expand the band gap energy as compared with that equals to the predetermined emission wavelength. The GaP alloy composition "a" exceeding 0.9 may relatively reduce the GaAs alloy composition, and may result in only a limited suppression effect of diffusion of the dopant because the growth temperature during the growth by a HVPE process becomes higher. On the other hand, the GaP alloy composition "a" of less than 0.5 relatively raises the GaAs alloy composition, and may undesirably narrow the band gap to thereby make the light absorption more likely to occur.

When the current spreading layer is designed to have a portion on the electrode forming side a high-GaAs-alloy-composition $GaAs_{1-a}P_a$ ($0 \leq a \leq 1$) layer having a GaAs alloy composition 1–a larger than that in the residual portion, and to have the high-concentration doped layer, containing n-type dopant of one or more selected from the group consisting of Si, S, Se and Te as a dopant, formed in the high-GaAs-alloy-composition $GaAs_{1-a}P_a$ layer, the excessive diffusion of the dopant can be suppressed. This can more effectively endow the high-concentration doped layer with the in-plane spreading effect of the current in the surficial portion of the current spreading layer. The high-GaAs-alloy-composition $GaAs_{1-a}P_a$ layer is preferably formed in a thickness slightly larger (by 0.5 m to 2 m or around) than that of the high-concentration doped layer. For example, for the case where the high-concentration doped layer is formed in a thickness of 1 m to 4 m, the high-GaAs-alloy-composition $GaAs_{1-a}P_a$ layer is preferably formed in a thickness of 2 m to 5 m.

In the invention, the current spreading layer is not precluded from forming the entire portion thereof by a HVPE process. However for the case where the current spreading layer and a portion of the light emitting layer portion in contact with the current spreading layer are composed of Group III-V compound semiconductors differing from each other in the lattice constants, and the difference between the lattice constants is large to a certain extent, formation of the current spreading layer directly on the light emitting layer portion by a HVPE process may degrade the crystallinity of the current spreading layer and may consequently degrade the emission performance. In one solution for the problem, the current spreading layer has an MO layer portion formed by a metal organic vapor-phase epitaxy process in a portion in contact with the light emitting layer portion, and has an HVPE layer portion formed by a hydride vapor-phase epitaxy process in the residual portion. This solution is successful in improving the crystallinity of the current spreading layer, and in obtaining the light emitting device having an excellent emission performance. That is, for the case where the current spreading layer and a portion of the light emitting layer portion in contact with the current spreading layer are composed of Group III-V compound semiconductors differing from each other in the lattice constants, it is preferable that the current spreading layer has an MO layer portion formed by a metal organic vapor-phase epitaxy process in a portion in contact with the light emitting layer portion, and has an HVPE layer portion formed by a hydride vapor-phase epitaxy process in the residual portion.

Next, in the light emitting device of the invention, a current blocking layer, which comprises a Group III-V compound semiconductor having a conductivity type different from that of the current spreading layer, can be formed as being buried in the current spreading layer. Therefore, it is characterized in that the method of fabricating of the invention comprises a current blocking layer forming step for forming a current blocking layer which comprises a Group III-V compound semiconductor having a conductivity type different from that of the current spreading layer, as being buried in the current spreading layer, and at least a portion of the current spreading layer covering the current blocking layer on the electrode side, opposite side of the light emitting layer portion, is formed in the second vapor-phase epitaxy process. Since the electrode can act as a light interceptor, application of a drive voltage to the electrode raises the in-device current density in a portion directly under the electrode or around, but lowers it in the circumferential area around the electrode from which the light is to be extracted. The light extraction efficiency is thus likely to degrade. The light extraction efficiency can however be raised if the aforementioned current blocking layer is formed as buried in the current spreading layer directly under the electrode, since the current blocking layer allows the current to bypass in the current spreading layer out from the electrode formation area. It is to be defined now that the current blocking layer in the context of this specification does not belong to the current spreading layer.

In this case, a current blocking layer forming step for forming the current blocking layer as being buried is necessary. In the invention, at least a portion of the current spreading layer covering the current blocking layer on the electrode forming side is formed in the second vapor-phase growth step (that is, by a HVPE process). If the current spreading layer covering the current blocking layer is formed by a MOVPE process or a LPE process, the resultant current spreading layer tends to have on the surface thereof a large step with a dulled shape of the underlain current blocking layer, while being associated with crystal defects. Such step and defects are causative of connection failure with the electrode, or degradation of efficiency and yield ratio of the wire bonding process since they may serve as a factor of detection error in the image processing for wire bonding to the electrode. On the contrary, formation of the portion of the current spreading layer portion covering the current blocking layer by a HVPE process hardly produces such step and crystal defects, and instead the current spreading layer having a smooth surface can be formed, and is less causative of the above-described nonconformities.

The current blocking layer forming step can specifically be carried out as including the process steps described below:

1. a third-vapor-phase growth process: in this step, a first layer which composes a part of the current spreading layer and is composed of a first-conductivity-type Group III-V compound semiconductor (that is, n-type), and a second layer which composes the current blocking layer and is composed of a second-conductivity-type Group III-V compound semiconductor (that is, p-type), are sequentially formed on the light emitting layer portion by a MOVPE process; and
2. etching step: in this step, an unnecessary portion of thus-obtained second-conductivity-type (p-type) compound semiconductor layer is removed so as to leave a portion to be the current blocking layer.

Moreover in the second vapor-phase growth step, a third layer which comprises a Group III-V compound semiconductor having a conductivity type same as that of the first layer, is formed so as to cover a portion of the second layer left unetched, by a hydride vapor-phase epitaxy (HVPE) process.

The first layer composes a portion of the current spreading layer, which serves as a base for the current blocking layer, and the second layer composes the current blocking layer. According to the above method, the third vapor-phase growth process for forming the first and second layers can be carried out in succession to the first vapor-phase growth process for forming the light emitting layer portion by the same MOVPE process, in a highly efficient manner. An especially large effect can be obtained when the first vapor-phase growth step and third vapor-phase growth step are successively carried out within the same growth chamber without taking the substrate out from such chamber.

In this case, after completion of the third vapor-phase growth step, the substrate must be taken out from the growth chamber, and transferred into another chamber in which the second vapor-phase growth step based on a HVPE process is to be proceeded. During the transfer, the first layer and second layer may adversely be affected by oxidation since they are exposed to an environment outside the chamber. It is also necessary to consider oxidation possibly occurs during etching if the second layer is to be chemically etched as described later. From this point of view, it is preferable to compose the first layer and second layer with a Group III-V compound semiconductor containing no Al (Aluminum) which is a highly oxidizable element. More specifically, all of the first layer, second layer and third layer can preferably be composed of $GaAs_{1-a}P_a$ ($0 \leq a \leq 1$: having a band gap energy larger than an optical energy corresponded to the peak emission wavelength of the light emitting layer portion). This is because $GaAs_{1-a}P_a$ ($0 \leq a \leq 1$) can be grown most rapidly with an excellent quality when the third layer is formed by a HVPE process, and because the same material is also adopted to the second layer for convenience, which is however to be formed by a MOVPE process. Furthermore, by adopting the same $GaAs_{1-a}P_a$ ($0 \leq a \leq 1$: having a band gap energy larger than an optical energy corresponded to the peak emission wavelength of the light emitting layer portion) again to the first layer, it is no more necessary to change the source gas when formation of the first layer based on a MOVPE process finishes and the process then advances to formation of the second layer in the third vapor-phase growth step, and this facilitates the fabrication. This is also advantageous in avoiding unnecessary band-edge discontinuity, so that there is no need to anticipate degradation of the emission performance.

It is to be noted that the second layer and first layer are composed of same $GaAs_{1-a}P_a$ ($0 \leq a \leq 1$) but opposite in the conductivity type. If the third layer is composed of an n-type $GaAs_{1-a}P_a$ ($0 \leq a \leq 1$) containing one or more selected from the group consisting of Si, S, Se and Te as the n-type dopant, the second layer can be composed of a p-type $GaAs_{1-a}P_a$ ($0 \leq a \leq 1$) containing Zn (Zinc), Mg (Magnesium) or the like as the dopant. In the current spreading layer for this case, it is also allowable to use different kinds of n-type dopants for the first layer to be formed by a MOVPE process and the third layer to be formed by a HVPE process.

From the viewpoint of raising current spreading effect, it is further advantageous to form the high-concentration doped layer to the third layer in contact with the first layer. Nonconformities such that one or more selected from the group consisting of Si, S, Se and Te as the n-type dopant diffused from the high-concentration doped layer adversely affects the light emitting layer portion through the third layer can effectively be suppressed, if the dopant concentration in a portion of the third layer other than the high-concentration doped layer, that is, a portion in contact with the first layer, is adjusted to as low enough as $1 \times 10^{17}/cm^3$ to $2 \times 10^{18}/cm^3$, both ends inclusive.

For the next etching step in the invention, the second layer can be etched by a chemical etching using an etching solution in a simple and efficient manner, while vapor-phase etching is also allowable. It is preferable in the chemical etching to use an etching solution exhibiting a higher etching activity to the second layer than to the first layer, and being capable of selectively etching the second layer. It is, however, not easy to find an etching solution exhibiting a distinct difference in the etching activities between the first and second layers when both of these layers are composed of a compound semiconductor material of same species. In an exemplary case where the etching solution exhibiting only a small difference in the etching activities is unwillingly used for the etching, also the first layer is heavily affected by the etching due to lack of the etching selectivity.

In this case, it is effective to form, between the first layer and the second layer, a fourth layer composed of a Group III-V compound semiconductor different from those composing both layers, and to selectively remove the second layer in the next etching step using the fourth layer as an etch stop layer. That is, by forming the fourth layer composed of a material different from that of the second layer as an underlying layer thereof, an etching solution having a suitable etching property for the second layer can readily be found even for the case where a suitable etching solution cannot be found for the first and second layers composed of the same material. By using such suitable etching solution as a first etching solution, the second layer can readily be etched in a selective manner while using the fourth layer as the etch stop layer in the etching step. While the fourth layer remains unetched directly below the second layer only in a portion to be left as the current blocking layer, the residual portion of the fourth layer by no means affects the emission characteristics or the like since the residual portion occurs only in a portion where the current is blocked by the current blocking layer.

The fourth layer is preferably composed of an Al-free, Group III-V compound semiconductor. If Al is contained in the fourth layer used as the etch stop layer in the selective etching of the second layer using the first etching solution, the etching solution may react with Al to undesirably produce an insulating Al oxide layer. Then another disadvantage may arise that thus-produced Al oxide layer may interfere etching for forming the third layer, when the third layer is to be formed by removing the exposed portion of the fourth layer using a second etching solution as described later. On the other hand, if the third layer is formed while leaving the fourth layer unetched, series resistance may increase by the Al oxide layer, and epitaxial growth of the third layer onto the fourth layer may be inhibited. Both cases may result in degraded emission characteristics.

For example, for the case where the second layer is composed of p-type $Al_dGa_{1-d}P$ ($0 \leq d \leq 1$) or p-type $(Al_bGa_{1-b})_cIn_{1-c}P$ ($0 < b \leq 1$; $0 \leq c \leq 0.5$), selection of n-type $GaAs_{1-a}P_a$ ($0 \leq a \leq 1$) for the first layer and hydrochloric acid as the etching solution for the second layer will be successful in etching the second layer while keeping a desirable selectivity over the first layer even if the fourth layer is not specifically provided. However for the case where oxidation of Al contained in the second layer may be anticipated, also the second layer is preferably composed of p-type $GaAs_{1-a}P_a$ ($0 \leq a \leq 1$). This, however, makes it more difficult to selectively etch the second layer by the chemical etching, and therefore it is advantageous to insert the fourth layer composed of $GaAs_{1-b}P_b$ ($a < b \leq 1$) having a larger GaP alloy composition than that of the second layer from the viewpoint of ensuring an excellent etching selectivity between the second and fourth layers. In particular for the case where the second and first layers are composed of $GaAs_{1-a}P_a$ ($0.5 \leq a \leq 0.9$) and the fourth layer is composed of GaP, the fourth layer can exhibit an excellent etch stop effect. A typical example of the first etching solution available herein is sulfuric acid or a mixed solution of sulfuric acid and hydrogen peroxide, with which the selective etching of the second layer while using the fourth layer as the etch stop layer can be proceeded in an effective manner.

The thickness of the fourth layer is preferably adjusted within a range from 1 nm to 100 nm. The thickness of less than 1 nm may be unsuccessful in obtaining a sufficient etch stop effect, and exceeding 100 nm may be uneconomic since the etch stop effect saturates.

One possible process is such that the outer portion of the second layer is selectively removed by the chemical etching using the first etching solution while using the fourth layer as the etch stop layer, then the fourth layer exposed out from the second layer is selectively removed by the chemical etching using the second etching solution while using the first layer as the etch stop layer to thereby expose the first layer, and the third layer can be grown so as to come into contact with the outer portion of the first layer in the second vapor-phase growth step. According to this process, unnecessary fourth layer does not remain between the first and third layers which compose the current spreading layer, around the second layer remained as the current blocking layer, and thus a problem of undesirable light absorption possibly ascribable to the fourth layer is less likely to occur. It is also allowable to form the third layer while leaving the fourth layer exposed out from the second layer unetched if the thickness of the fourth layer is adjusted within a small range from 10 nm to 50 nm, since such thin fourth layer can almost exclude influences of the light absorption.

The light emitting layer portion can be composed as having a double heterostructure in which an n-type cladding layer, an active layer and a p-type cladding layer, where all of which are composed of $(Al_xGa_{1-x})_yIn_{1-y}P$ (where, $0 \leq x \leq 1$ and $0 < y \leq 1$) containing two or more Group III elements, are stacked in this order as viewed from the electrode side, where the electrode provided for applying light emission drive voltage to the light emitting layer portion. By virtue of energy barriers ascribable to difference of band gaps between the active layer and cladding layer on both sides thereof, holes and electrons injected into the active layer are well confined within a narrow active layer and allowed to efficiently recombine, and this ensures an excellent emission efficiency. In addition, compositional adjustment of the active layer can further expand a possible range of emission wavelength.

In the method of fabricating of the invention, an off-angled substrate can be used as the single crystal substrate. It is to be noted that "off-angled" in the context of the specification means that the main crystal axis of the single crystal substrate, on which the compound semiconductor layers are stacked, is tilted by a predetermined angle with respect to the reference direction defined either to <100> or <111> direction.

The light emitting layer portion comprising an alloy compound semiconductor containing two or more Group III elements, for example, the light emitting layer portion comprising $(Al_xGa_{1-x})_yIn_{1-y}P$ tends to reduce the band gap energy due to the aforementioned ordering or biased distribution of the Group III element (Al, Ga, In) for the case where non-off-angled, single crystal substrate is used, and this tends to cause variation in the emission wavelength in the shorter wavelength region. One possible measure for solving this problem is a method of compensating the shift of emission wavelength by raising alloy composition of AlP, which has a large band gap energy. Such raising of AlP alloy composition, however, alters the band structure so as to increase indirect transition components, and this undesirably tends to lower the emission intensity. Therefore, for the case where the light emitting layer portion is composed of an alloy compound semiconductor containing two or more Group III elements such as $(Al_xGa_{1-x})_yIn_{1-y}P$ or the like, use of the off-angled single crystal substrate is successful in obtaining readily the light emitting layer portion which is effectively suppressed a variation in the spectral profile of flux of light or center wavelength. The reason is speculated that provision of a proper off-angled nature to the single crystal substrate can considerably reduce the above-described ordering or biased distribution of the Group III elements.

When the current spreading layer composed of a III-V compound semiconductor, on the light emitting layer portion grown by a MOVPE process, is formed by a HVPE process, unlike the case where the current spreading layer is formed by a MOVPE process or LPE (Liquid Phase Epitaxy) process, it is advantageous in obtaining the current spreading layer with an excellent smoothness since the surface of the finally-obtained current spreading layer hardly causes facet and surface roughening ascribable to the off-angle of single crystal substrate. Therefore, the surface of the current spreading layer is smoothened, and the adhesiveness of the electrode to be formed on the current spreading layer is improved. This is also advantageous for the case where automatic wire bonding to the electrode is carried out based on image processing, since image detection errors due to the surface roughening is reduced and the process efficiency and yield ratio of the wire bonding process can be improved.

For the case where the light emitting layer portion is composed of $(Al_xGa_{1-x})_yIn_{1-y}P$, the single crystal substrate may be a GaAs single crystal substrate having the main axis tilted by an angle 1° to 25° with respect to the <100> direction or <111> direction. The off-angle less than 10 may be insufficient for suppressing the aforementioned variation in the emission characteristics (emission spectral profile and center wavelength), and exceeding 25° may inhibit normal growth of the light emitting layer portion. Effect of the invention becomes particularly discriminative when the GaAs single crystal substrate has the main axis thereof tilted by an angle as defined in the above with respect to the <100> direction.

The single crystal substrate more preferably has the main axis thereof tilted by 10° to 20°. Use of such largely-off-angled GaAs substrate can further improve the smoothing effect of the surface of the current spreading layer finally attained by a HVPE process in the second vapor-phase growth step. According to the investigation by the inventors, the single crystal substrate having an angle of tilt of 1° to 10° successfully suppressed a facet-like uniform surface irregularity having a small amplitude, but not a few projection-like crystal defects having a large amplitude sometimes remained, and caused nonconformities such as detection errors in image processing in the wire bonding process. On the contrary, raising of the angle of tilt to as large as 10° to 20° can effectively suppress generation of such projection-like crystal defects.

As well as prevention of the projection-like crystal defects, optimization of the growth temperature of the current spreading layer in a HVPE process is also an essential point to obtain the desirable surface of the current spreading layer in the manufacturing step. One of essential effects of selection of the angle of tilt of the single crystal substrate within a range from 10° to 20° resides in that an appropriate range of the growth temperature of the current spreading layer by a HVPE process can be lowered. Lowering of the growth temperature of the current spreading layer can desirably moderate thermal history possibly exerted on the light emitting layer portion which underlies the current spreading layer during the growth of the current spreading layer, and can make dopant profile at the p-n junction in the light emitting layer portion less causative of degradation by diffusion. In particular for the light emitting layer portion having a double heterostructure, it is desired for the active layer to reduce the dopant concentration as low as possible in order to raise efficiency of emission by recombination. Lowering of the growth temperature of the current spreading layer can successfully suppress the dopant diffusion from the cladding layer towards the active layer, can raise the internal quantum efficiency of the light emitting device, and can largely improve the emission performance. Lowering of the growth temperature is still also advantageous in that the current spreading layer can be made more thicker while keeping the dopant profile in a desirable state, and that effect of improving the emission intensity becomes particularly eminent when the thickness of the current spreading layer is increased as large as 50 m or above.

The angle of tilt less than 10° or exceeding 20° may result in only an insufficient effect of preventing generation of the projection-like crystal defects, and a poor effect of lowering the appropriate growth temperature of the current spreading layer. Therefore the angle of tilt is more preferably set within a range from 13° to 17°.

In this case, in the growth of the above-described current spreading layer composed of $GaAs_{1-a}P_a$ ($0 \leq a \leq 1$) by a HVPE process in the second vapor-phase growth step, the growth temperature is preferably set within a range from 640° C. to 750° C., both ends inclusive. The temperature lower than 640° C. may result in only an insufficient effect of smoothing the surface of the current spreading layer, and in particular of suppressing generation of the projection-like crystal defects. On the contrary, the temperature higher than 750° C. may result in only a limited effect of suppressing degradation of dopant profile of the light emitting layer portion. The growth temperature is more preferably set within a range from 680° C. to 720° C. (in particular for the case the angle of tilt falls within a range from 13° to 17°). This temperature setting ensures a particularly discriminative effect of improving the emission intensity when the current spreading layer has a thickness of as large as 50 m or above (and 200 m or below).

A second constitution of a light emitting device of the invention has a light emitting layer portion and a current spreading layer, respectively composed of a Group III-V compound semiconductor, and an electrode for applying light emission drive voltage to the light emitting layer portion, once formed on a single crystal substrate by epitaxial growth, wherein:

the light emitting layer portion has a double heterostructure in which an n-type cladding layer, an active layer and a p-type cladding layer, all of which being composed of $(Al_xGa_{1-x})_yIn_{1-y}P$ (where, $0 \leq x \leq 1$ and $0 < y \leq 1$) containing two or more Group III elements, are stacked in this order as viewed from the electrode side, and the n-type cladding layer is composed of n-type $(Al_xGa_{1-x})_yIn_{1-y}P$ containing one or more selected from the group consisting of Si, S, Se and Te as the dopant;

the current spreading layer is formed, using one or more selected from the group consisting of Si S, Se and Te as the dopant, as an n-type $GaAs_{1-a}P_a$ ($0 \leq a \leq 1$) layer having a band gap energy larger than an optical energy corresponded to the peak emission wavelength of the light emitting layer portion; and the current spreading layer has a C concentration lower than that in the n-type cladding layer.

As for light emitting devices in which the light emitting layer portions are composed with an $(Al_xGa_{1-x})_yIn_{1-y}P$ double heterostructure, for the case such as the invention where the n-type cladding layer side is defined as the light extraction side and the current spreading layer is provided on this side, the current spreading layer, which has conventionally been formed by a MOVPE process, contains a large amount of residual H and C, so that the concentration of n-type dopant must be set considerably higher than that in the n-type cladding layer in order to compensate a portion of the dopant contributing as the p-type dopant in the residual C. Nonconformities of shortened device life caused by such excessive dopant concentration are as described elsewhere in the above.

In the second constitution of a light emitting device of the invention, the current spreading layer is composed of an n-type $GaAs_{1-a}P_a$ ($0 \leq a \leq 1$) containing one or more selected from the group consisting of Si, S, Se and Te as the dopant, and the C concentration in the current spreading layer is set smaller than that in the n-type cladding layer. Such quantitative relation of the C concentration can readily be attained by forming the current spreading layer by a HVPE process. As a consequence, a sufficient level of conductivity can be ensured even when the concentration of one or more selected from the group consisting of Si, S, Se and Te as the n-type dopant in the current spreading layer is set lower than that in the n-type cladding layer, because only a small amount of C can act as the p-type dopant. Thus lowered concentration of the n-type dopant can successfully improve the device life.

When the light emitting layer portion is composed of $(Al_xGa_{1-x})_yIn_{1-y}P$ (where, $0 \leq x \leq 1$ and $0 < y \leq 1$) as described in the above, it is preferable to form the current spreading layer as an n-type $GaAs_{1-a}P_a$ ($0 \leq a \leq 1$; having a band gap energy larger than an optical energy corresponded to the peak emission wavelength of the light emitting layer portion) layer, to form a portion of the current spreading layer in contact with the light emitting layer portion as an MO layer portion grown by a metal organic vapor-phase epitaxy process, and to form the residual portion as an HVPE layer portion grown by a hydride vapor-phase epitaxy (HVPE) process. Although $(Al_xGa_{1-x})_yIn_{1-y}P$ composing the light emitting layer portion and n-type $GaAs_{1-a}P_a$ ($0 \leq a \leq 1$) composing the current spreading layer are likely to largely differ from each other in the lattice constants, the crystallinity of the current spreading layer can be improved by first forming the portion of the current spreading layer in contact with the light emitting layer portion by a metal organic vapor-phase epitaxy process, and then by forming the residual portion of the current spreading layer by a HVPE process, as described in the above.

In the light emitting devices according to the first invention, the portion of the current spreading layer formed by a HVPE process preferably has a C concentration of $7 \times 10^{17}/cm^3$ or below. It is also allowable that the current spreading layer and a portion of the light emitting layer portion in contact with the current spreading layer are composed of Group III-V compound semiconductors differing from each other in the lattice constants, and the current spreading layer has an MO layer portion formed by a metal organic vapor-phase epitaxy process in a portion in contact with the light emitting layer portion, and has an HVPE layer portion formed by a hydride vapor-phase epitaxy process in the residual portion.

In the light emitting device according to the second invention, the current spreading layer has an MO layer portion formed by a metal organic vapor-phase epitaxy process in a portion in contact with the light emitting layer portion, and has an HVPE layer portion formed by a hydride vapor-phase epitaxy process in the residual portion.

In the light emitting device according to the first and second inventions, the thickness of the current spreading layer is preferably set within a range from 5 m to 200 m. In the surficial portion of the current spreading layer including the main surface on the side on which the electrode is formed, it is allowable to form a high-concentration doped layer having a carrier concentration of one or more selected from the group consisting of Si, S, Se and Te as the dopant higher than that in the residual portion of the current spreading layer. The current spreading layer is formed as an n-type semiconductor layer containing one or more selected from the group consisting of Si, S, Se and Te as a dopant(s), where carrier concentration of the dopant is set to $1 \times 10^{18}/cm^3$ to $5 \times 10^{19}/cm^3$ for the high-concentration doped layer, and $1 \times 10^{17}/cm^3$ to $1 \times 10^{18}/cm^3$ for the residual portion. It is also allowable to compose a portion of the current spreading layer, on which the electrode is formed, with a high-GaAs-alloy-composition $GaAs_{1-a}P_a$ ($0 \leq a \leq 1$) layer having a GaAs alloy composition 1−a larger than that in the residual portion, and to form the high-concentration doped layer containing one or more selected from the group consisting of Si, S, Se and Te as a dopant in such high-GaAs-alloy-composition $GaAs_{1-a}P_a$ layer.

It is still also allowable to remain the single crystal substrate, once used for the epitaxial growth of the light emitting layer portion and current spreading layer, unremoved within the device. For the case where a light-absorbing, single crystal substrate such as GaAs substrate is used, the substrate may be removed after the epitaxial growth of the light emitting layer portion and current spreading layer. The method of fabricating the light emitting device in the invention in which the single crystal substrate is not removed will be described as below:

a method of fabricating a light emitting device is such as fabricating a light emitting device having a light emitting layer portion and a current spreading layer respectively composed of a Group III-V compound semiconductor, and an electrode for applying light emission drive voltage to the light emitting layer portion, stacked in this order on a single crystal substrate, the method comprises:

a first vapor-phase growth step for forming the light emitting layer portion on the single crystal substrate by a metal organic vapor-phase epitaxy process;

a second vapor-phase growth step, carried out after the first vapor-phase growth step, for forming the current spreading layer as an n-type semiconductor layer based on a hydride vapor-phase epitaxy process which is different from the metal organic vapor-phase epitaxy process.

In similar, a first constitution of the light emitting device of the invention will be described as below:

a light emitting device has a light emitting layer portion and a current spreading layer respectively composed of a Group III-V compound semiconductor, formed on a single crystal substrate, wherein:

the light emitting layer portion is formed on the single crystal substrate by a metal organic vapor-phase epitaxy process; and the current spreading layer, on the light emitting layer portion, is formed as an n-type semiconductor layer by a hydride vapor-phase epitaxy process which is different from the metal organic vapor-phase epitaxy process.

A second constitution of the light emitting device of the invention will be described as below:

a light emitting device has a light emitting layer portion and a current spreading layer, respectively composed of a Group III-V compound semiconductor, and an electrode for applying light emission drive voltage to the light emitting layer portion, formed in this order on a single crystal substrate, wherein:

the light emitting layer portion has a double heterostructure in which an n-type cladding layer, an active layer and a p-type cladding layer, all of which being composed of $(Al_xGa_{1-x})_yIn_{1-y}P$ (where, $0 \leq x \leq 1$ and $0 < y \leq 1$) containing two or more Group III elements, are stacked in this order as viewed from the electrode side, and the n-type cladding layer is composed of n-type $(Al_xGa_{1-x})_yIn_{1-y}P$ containing one or more selected from the group consisting of Si, S, Se and Te as the dopant;

the current spreading layer is formed, using one or more selected from the group consisting of Si, S, Se and Te as the dopant, as an n-type $GaAs_{1-a}P_a$ ($0 \leq a \leq 1$) layer having a band gap energy larger than an optical energy corresponded to the peak emission wavelength of the light emitting layer portion; and the current spreading layer has a C concentration lower than that of the n-type cladding layer.

DESCRIPTION OF THE PREFERRED EMBODIMENTS

Some embodiments of the present invention will be described referring to the accompanying drawings.

Figure 1:
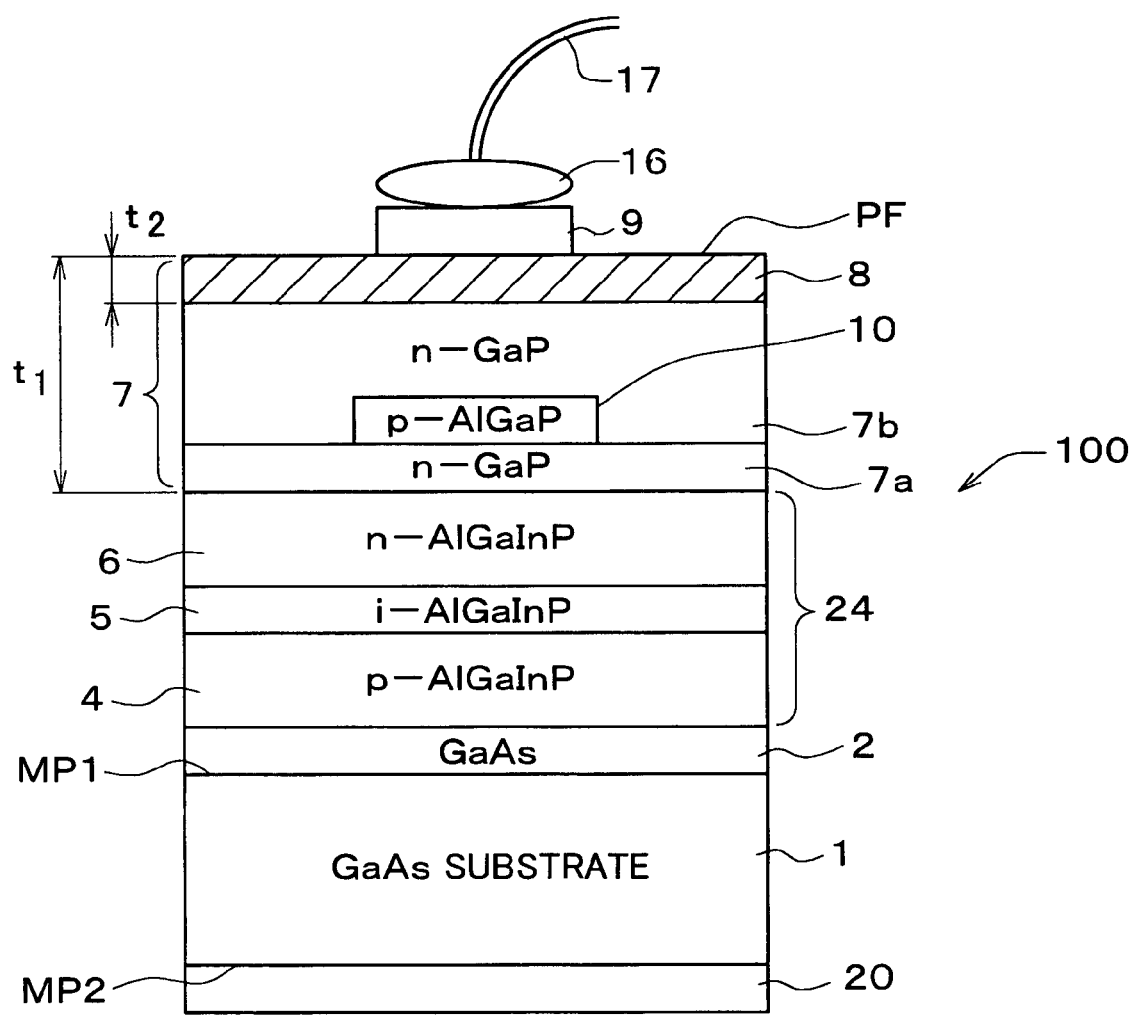
FIG. 1 is a schematic view of a stacked structure of an exemplary light emitting device of the invention.

FIG. 1 is a schematic view of a light emitting device 100 according to the embodiment of the invention. The light emitting device 100 has an essential portion of the device formed on a first main surface MP1 of a p-type GaAs single crystal substrate (simply referred to as "substrate", hereinafter) 1. A p-type GaAs buffer layer 2 is formed so as to contact with the first main surface MP1 of the substrate 1, and on the buffer layer 2, a light emitting layer portion 24 is formed. On the light emitting layer portion 24, a current spreading layer 7 is formed, and further on the current spreading layer 7, a first electrode 9 for applying emission drive voltage to the light emitting portion 24 is formed. On a second main surface MP2 of the substrate 1, a second electrode 20 is similarly formed over the entire surface thereof. The first electrode 9 is formed approximately at the center of the first main surface PF, where the area around the first electrode 9 serves as an area through which light from the light emitting layer portion 24 is extracted. At the center of the first electrode 9, a bonding pad 16 typically composed of Au is disposed to which a electrode wire 17 is bonded.

The light emitting layer portion 24 is composed so that an active layer 5 composed of a non-doped $(Al_xGa_{1-x})_yIn_{1-y}P$ alloy (where, $0 \leq x \leq 0.55$, $0.45 \leq y \leq 0.55$) is placed between an n-type cladding layer 6 composed of n-type $(Al_zGa_{1-z})_yIn_{1-y}P$ (where, $x<z \leq 1$) and a p-type cladding layer 4 composed of p-type $(Al_zGa_{1-z})_yIn_{1-y}P$ (where, $x<z \leq 1$). Further, the n-type AlGaInP cladding layer 6 is disposed on the first electrode 9 side, and the p-type AlGaInP cladding layer 4 is disposed on the second electrode 20 side. The device thus has negative polarity on the first electrode 9 side. It is to be noted now that "non-doped" in this context means that "the dopant is not intentionally added", and is not precluded from being inevitably added with the dopant component during normal fabrication processes (where the upper limit set at $10^{13}$ to $10^{16}/cm^3$ or around).

The current spreading layer 7 is formed as an n-type GaP layer containing one or more selected from the group consisting of Si, S, Se and Te as a dopant. The C concentration and the concentration of one or more selected from the group consisting of Si, S, Se and Te as the n-type dopant in the current spreading layer 7 are individually set lower than those in the n-type cladding layer 6. The current spreading layer 7 also has a current blocking layer 10 composed of p-type $Al_dGa_{1-d}P$ (e.g., d=0.2), which is buried therein at a position corresponded to the first electrode 9. The thickness $t_1$ of the current spreading layer 7 typically falls within a range from 5 m to 20 m (10 m, for example). The thickness of the current blocking layer 10 is typically falls within a range from 0.05 m to 1 m (0.1 m, for example).

In a surficial area of the current spreading layer 7 including the main surface on the side on which the first electrode 9 is formed, a high-concentration doped layer 8 having the concentration of one or more selected from the group consisting of Si, S, Se and Te as the n-type dopant higher than that in the residual portion of the current spreading layer 7 is formed. The carrier concentration of one or more selected from the group consisting of Si, S, Se and Te as the n-type dopant of the current spreading layer 7 is adjusted within a range from $1 \times 10^{18}/cm^3$ to $5 \times 10^{19}/cm^3$ ($1 \times 10^{19}/cm^3$, for example) for the high-concentration doped layer 8, and from $1 \times 10^{17}/cm^3$ to $1 \times 10^{18}/cm^3$ ($8 \times 10^{17}/cm^3$, for example) for the residual portion.

The thickness $t_2$ of the high-concentration doped layer 8 is adjusted within a range from 1 m to 4 m (3 m, for example). It is to be noted that the thickness $t_2$ of the high-concentration doped layer 8 is defined by setting a boundary between the high-concentration doped layer 8 and the residual portion at a position along the thickness-wise direction where $(N_{max}+N_{min})/2$ is established, where $N_{max}$ is concentration of the n-type dopant in the surficial area of the current spreading layer where the dopant concentration becomes maximum, and $N_{min}$ is an n-type dopant concentration in the portion of the current spreading layer 7 not affected by the diffusion. The dopant concentration and C concentration in the individual layers herein are defined as those measured by secondary ion mass spectrometry (SIMS). The carrier concentration can be determined by any publicly-known conductivity measurement.

Of the current spreading layer 7, the portion resides between the n-type cladding layer 6 and current blocking layer 10 refers to a first layer 7a formed by a MOVPE process. On the opposite side of the first layer 7a while placing the current blocking layer 10 in between, a third layer 7b which composes a principal portion of the current spreading layer 7 is formed so as to cover, together with the first layer 7a, the current blocking layer 10. The third layer 7b is formed by a HVPE process described later, and the surficial portion thereof on the first electrode 9 side is provided as the aforementioned high-concentration doped layer 8 formed by doping one or more selected from the group consisting of Si, S, Se and Te as the n-type dopant.

The C concentration in the current spreading layer 7 formed by a HVPE process can be adjusted lower than the C concentration in the n-type cladding layer 6 (generally $15 \times 10^{17}/cm^3$ or around) formed by a MOVPE process. More specifically, the portion of the current spreading layer formed by a HVPE process preferably has the C concentration of $7 \times 10^{17}/cm^3$ or below. In the embodiment, of the current spreading layer 7, only the first layer 7a is formed by a MOVPE process and has a slightly higher C concentration. On the other hand, the third layer 7b has a C concentration of as low as $7 \times 10^{17}/cm^3$ or below, and normally $2 \times 10^{17}/cm^3$ or below. Because the thickness of the first layer 7a is far smaller than that of the third layer 7b, the C concentration in the current spreading layer 7 is, in any event, sufficiently lower than that in the n-type cladding layer 6. Of the third layer 7b composing the essential portion of the current spreading layer 7, the portion other than the high-concentration doped layer 8 can successfully ensure a satisfactory level of electric conductivity because only a small amount of C acts as the p-type dopant even when the concentration of one or more selected from the group consisting of Si, S, Se and Te as the n-type dopant is adjusted lower than that in the n-type cladding layer 6. This contributes to longer device life.

In the current spreading layer 7, in-plane current spreading mainly proceeds within the high-concentration doped layer 8. Because the inner portion of the current spreading layer 7 other than the high-concentration doped layer 8 has a lower carrier concentration of the dopant and consequently has a higher resistance, the current once entered the inner portion is less likely to re-spread along the in-plane direction, but is instead more likely to be bypassed towards the circumferential area around the electrode 9. Thus the light extraction efficiency improves.

While the first layer 7a and the third layer 7b in the embodiment were formed using the same compound semiconductor (more specifically, GaP), they can also be formed using compound semiconductors differing with each other. For example, the first layer 7a can be formed using n-type GaAs$_{1-a}$P$_a$ (having a band gap energy larger than an optical energy corresponded to the peak emission wavelength of the light emitting layer portion), and the third layer 7b using n-type GaP. Both of the first layer 7a and the third layer 7b are added with n-type dopant. It is allowable to use different kinds of n-type dopant for the first layer 7a and the third layer 7b.

Next paragraphs will describe a method of fabricating the light emitting device 100 shown in FIG. 1.

Figure 2A:
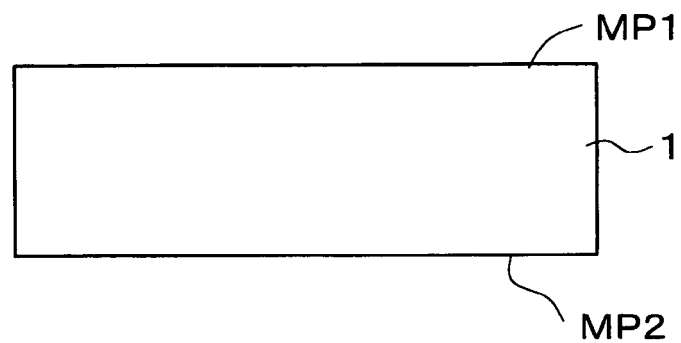
FIG. 2A is an explanatory chart showing a process step of fabricating the light emitting device shown in FIG. 1.
Figure 2B:
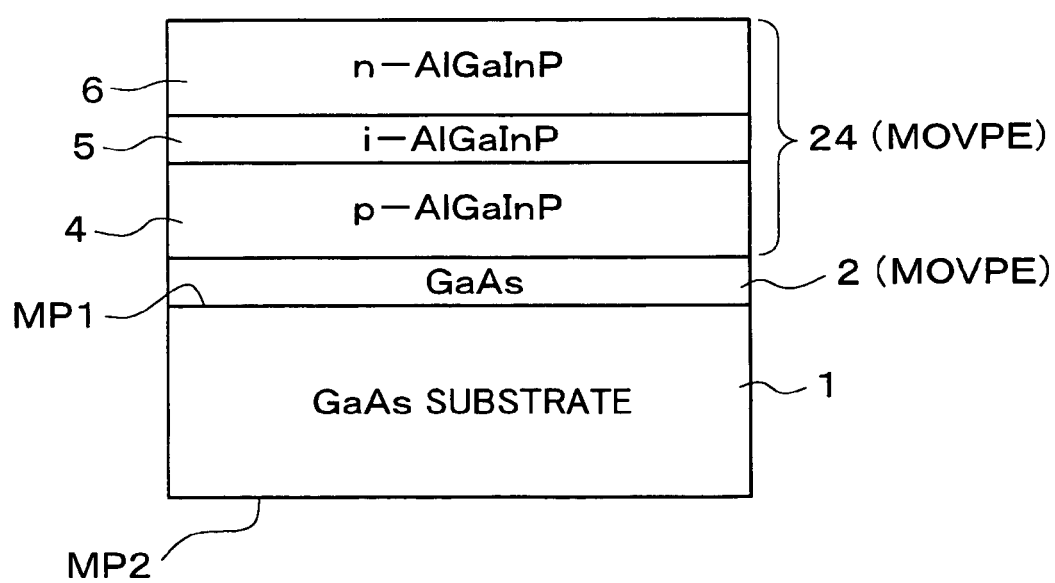
FIG. 2B is an explanatory chart as continued from FIG. 2A.

First, as shown in FIG. 2A for process step 1, a p-type GaAs single crystal substrate 1 is prepared. Next, as shown in FIG. 2B for process step 2, on the first main surface MP1 of the substrate 1, the p-type GaAs buffer layer 2 of 0.5 m thick and the light emitting layer portion 24 are formed, where the light emitting layer portion 24 comprises the p-type cladding layer 4 (containing Zn or Mg as the p-type dopant, where also C ascribable to organo-metallic compound molecules possibly contributes as the p-type dopant) of 1 m thick, the (non-doped) active layer 5 of 0.6 m thick, and an n-type cladding layer 6 of 1 m thick (containing one or more selected from the group consisting of Si, S, Se and Te as the n-type dopant), all of which composed of (Al$_x$Ga$_{1-x}$)$_y$In$_{1-y}$P, stacked in this order by epitaxial growth (first vapor-phase growth step). The epitaxial growth of the individual layers can be carried out according to the publicly-known MOVPE process. Examples of the source gases available as the individual sources of Al, Ga, In (indium) and P (phosphorus) are as follows:

Al source gas: trimethyl aluminum (TMAl), triethyl aluminum (TEAl), etc.;
Ga source gas: trimthyl gallium (TMGa), triethyl gallium (TEGa), etc.;
In source gas: trimethyl indium (TMIn), triethyl indium (TEIn), etc.; and
P source gas: trimethyl phosphorus (TMP), triethyl phosphorus (TEP), phosphine (PH$_3$), etc.

Figure 3A:
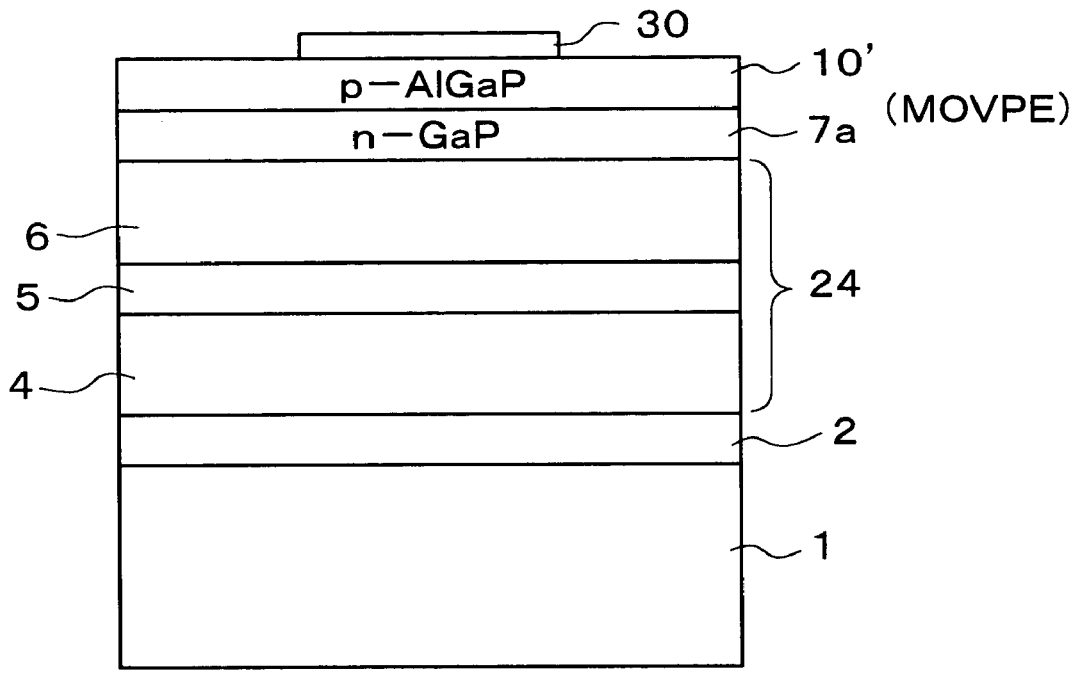
FIG. 3A is an explanatory chart as continued from FIG. 2B.
Figure 3B:
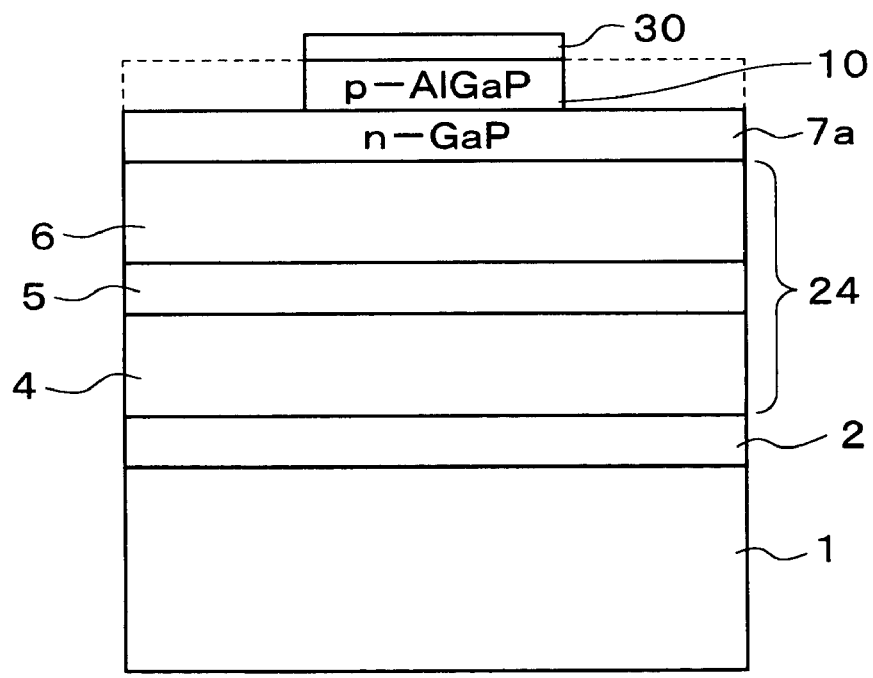
FIG. 3B is an explanatory chart as continued from FIG. 3A.

Next as shown in FIG. 3A for process step 3, successively in the same reaction chamber used in the first vapor-phase growth step, the first layer 7a composed of n-type GaP (MO layer portion) and a second layer 10' composed of p-type Al$_d$Ga$_{1-d}$P (e.g., d=0.2) on the light emitting layer portion 24 already formd, which is processed to form the current blocking layer, are sequentially formed by a MOVPE process. Next, a portion of the second layer 10' to be left unetched as the current blocking layer 10 is covered with a photo-resist layer 30. Next, as shown in FIG. 3B for process step 4, etching is carried out using a first etching solution comprising hydrochloric acid so as to selectively remove the portion of the second layer 10' not covered by the photo-resist layer 30. After the etching, the etching solution is rinsed off, and the photo-resist layer 30 is removed.

Figure 4A:
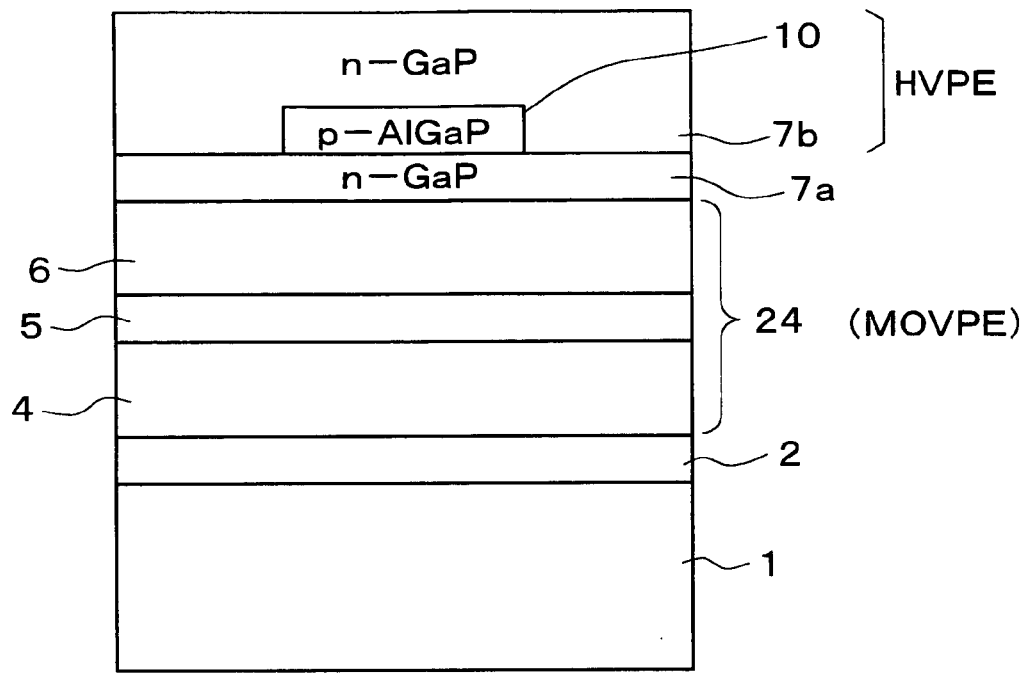
FIG. 4A is an explanatory chart as continued from FIG. 3B.

Next, as shown in FIG. 4A for process step 5, the third layer 7b (HVPE layer portion) composed of n-type GaP is formed by a HVPE process so as to cover the current blocking layer 10 (second vapor-phase growth step). In a HVPE process, Ga as a Group III element is kept under heating at a predetermined temperature within a chamber, hydrogen chloride gas is supplied over Ga to thereby allow GaCl to produce as expressed by the reaction formula (1) below, and the resultant GaCl is supplied to the substrate together with H$_2$ gas as a carrier gas.

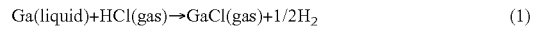

$$Ga(liquid) + HCl(gas) \rightarrow GaCl(gas) + 1/2H_2 \qquad (1)$$

When GaP is grown, the growth temperature is typically set at 640 to 860° C. P as a Group V element is supplied in a form of PH$_3$ together with H$_2$ as a carrier gas. Further, the n-type dopant being one or more selected from the group consisting of Si, S, Se and Te are respectively supplied in the form of SiH$_4$, H$_2$S, H$_2$Se and DETe. The third layer 7b which composes the essential portion of the current spreading layer 7 can be formed as expressed by the reaction formula (2) below, in which Ga is efficiently reacted with P since GaCl has the high reactivity with PH$_3$.

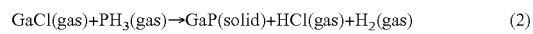

$$GaCl(gas) + PH_3(gas) \rightarrow GaP(solid) + HCl(gas) + H_2(gas) \qquad (2)$$

It is allowable that the substrate 1 is such as having the main axis "A" tilted by an angle within a range from 1° to 25° with respect to the <100> direction (where, the main axis "A" may also be such as being tilted by the same degrees of angle with respect to the <111> direction). In particular, using the GaAs single crystal substrate having the main axis tilted by 10° to 20° (preferably 13° to 17°) is effective in suppressing generation of the large-amplitude, projection-like crystal defects on the surface of the current spreading layer 7, successfully lowers the appropriate growth temperature of the current spreading layer 7 in a HVPE process to as low as 640° C. to 750° C. (more preferably 680° C. to 720° C.) which is advantageous in obtaining the smooth surface status, desirably suppresses diffusion of dopants from the n-type cladding layer 6 and p-type cladding layer 4 towards the active layer 5, and consequently suppresses degradation of the dopant profile of the light emitting layer portion 24 possibly caused by the diffusion.

After the growth of the above-described third layer 7b, the process advances to process step 6, and the high-concentration doped layer 8 is formed to have a high concentration of the dopant by doping one or more selected from the group consisting of Si, S, Se and Te as the n-type dopant.

After completion of these process steps, the first electrode 9 and second electrode 20 are formed by vacuum evaporation process, further on the first electrode 9 a bonding pad 16 is disposed, and the substrate is then subjected to baking at a proper temperature for fixing the electrode. The second electrode 20 is then fixed to a terminal electrode (also used as a device supporting base), not shown, using a conductive paste such as an Ag paste, an Au-made wire 17 is bonded so as to bridge the bonding pad 16 and other terminal electrodes, and the entire portion is molded with a resin to thereby obtain the light emitting device 100. The bonding of the wire 17 herein is carried out using an automatic bonding apparatus in which images of the first main surface of the device are taken by a camera, and the area around the bonding pad 16 is identified by a publicly-known image processing technique.

Figure 4B:
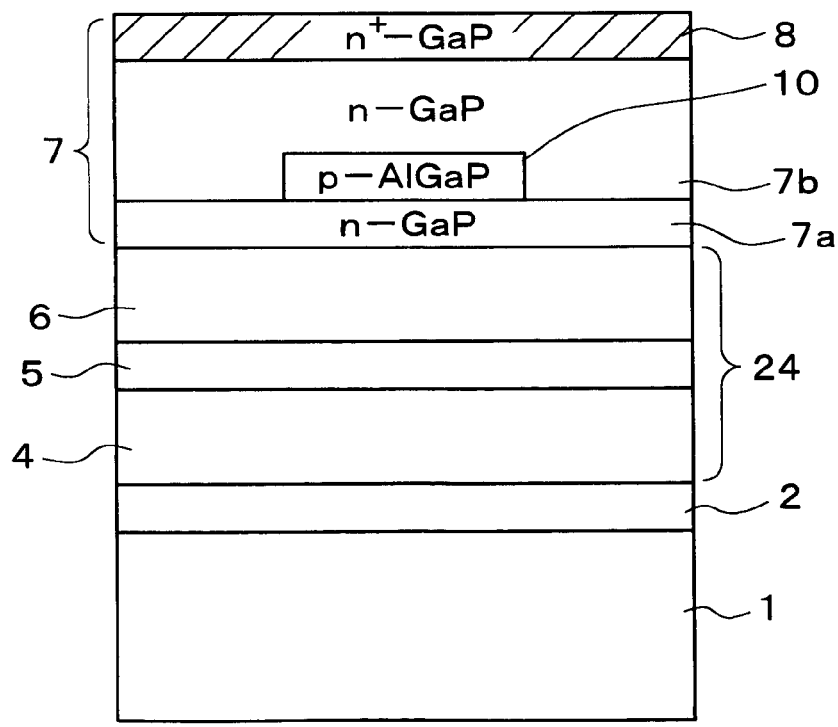
FIG. 4B is an explanatory chart as continued from FIG. 4A.
Figure 5:
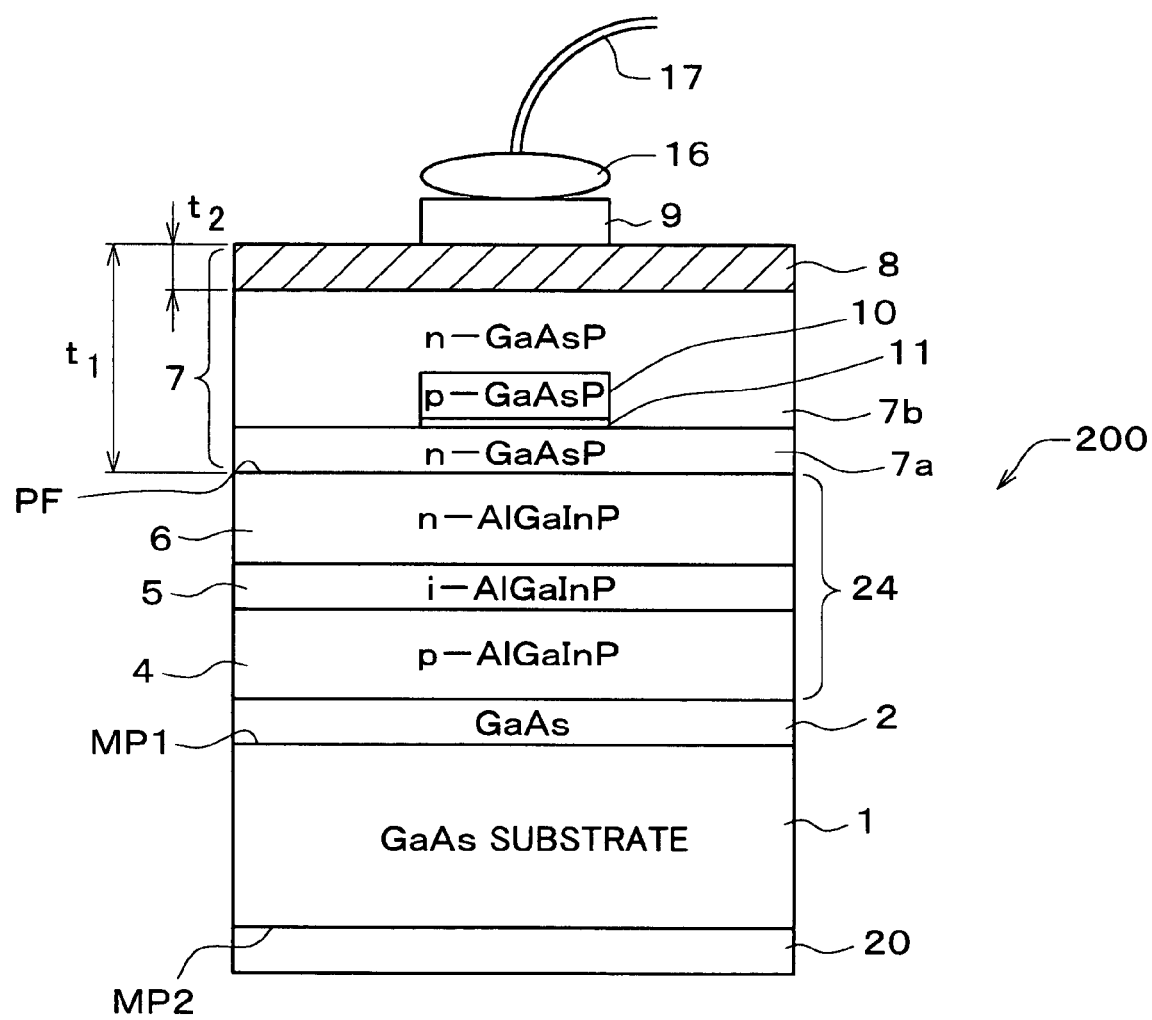
FIG. 5 is a schematic view of a first modified example of the light emitting device shown in FIG. 1.
Figure 6A:
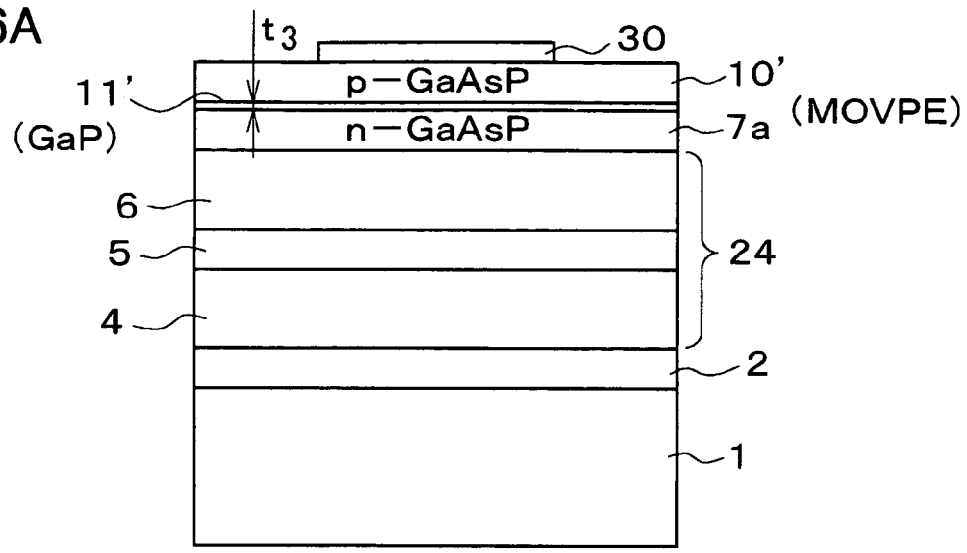
FIG. 6A is a explanatory chart showing a process step of fabricating the light emitting device shown in FIG. 5, while focusing differences from the steps shown in FIGS. 3A and 3B.
Figure 6B:
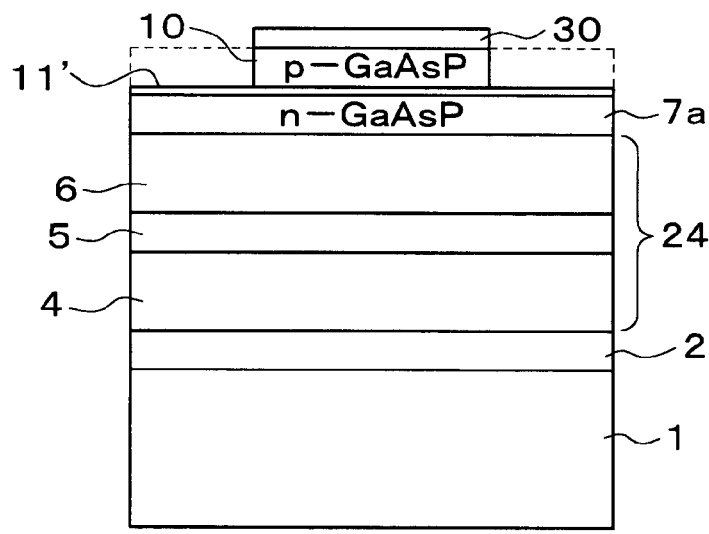
FIG. 6B is an explanatory chart as continued from FIG. 6A.
Figure 6C:
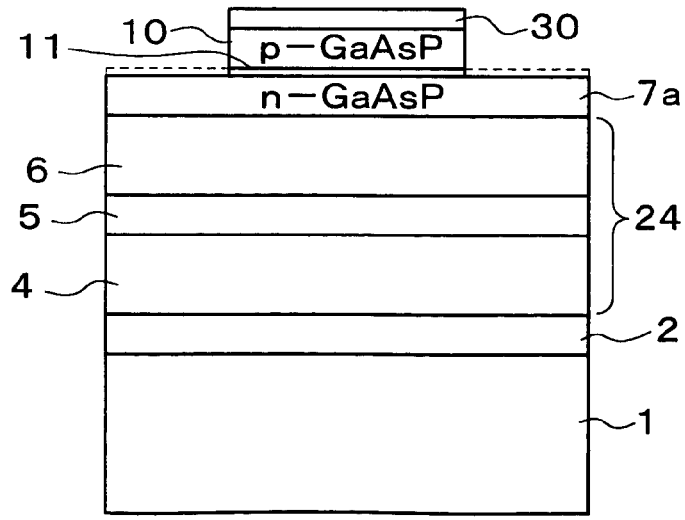
FIG. 6C is an explanatory chart as continued from FIG. 6B.

Next paragraphs will describe various modified examples of the light emitting device 100 (the following description will be made based on the constitution of the light emitting device 100 previously shown in FIG. 1, where the common components are expressed by the same reference numerals without giving detailed explanation, and only different points will be described). A light emitting device 200 shown in FIG. 5 is such that the current blocking layer 10 is composed of GaAsP (where, p-type), which is the same material with that forming the first layer 7a and the third layer 7b composing the current spreading layer 7. In this case, the process steps shown in FIGS. 3A and 3B are altered to those shown in FIGS. 6A through 6C. More specifically, as shown in FIG. 6A for process step 7, a fourth layer 11' composed of GaP is formed as an etch stop layer, and then as shown in FIG. 6B for process step 8, the second layer 10', which is to be processed to the current blocking layer 10, composed of $GaAs_{1-a}P_a$ ($0.5 \leq a \leq 0.9$) is selectively etched using a mixed solution of sulfuric acid and hydrogen peroxide. Further in process step 9 shown in FIG. 6C, the portion of the fourth layer 11' exposed out from the current blocking layer 10 is removed by etching. The fourth layer 11 directly under the current blocking layer 10 remains unetched. The process steps thereafter are same with those illustrated in FIGS. 4A and 4B.

For the case where the current spreading layer is composed of $GaAs_{1-a}P_a$ ($0.5 \leq a \leq 0.9$) and the current blocking layer is composed of $Al_dGa_{1-d}P$ ($d=0.2$, for example), when the $GaAs_{1-a}P_a$ layer (the third layer 7b) is formed by a HVPE process, $AsH_3$ is used together with $PH_3$ in the reaction formula (2), and the growth temperature is set within a slightly low range from 640° C. to 830° C.

When the current spreading layer is composed of $GaAs_{1-a}P_a$, the growth temperature in the above-described HVPE process can be lowered. This is successful in more efficiently suppressing nonconformities such that the n-type dopant (one or more selected from the group consisting of Si, S, Se and Te) excessively diffuses towards the light emitting layer portion side, or that the n-type dopant contained in the n-type cladding layer 6 in the light emitting layer portion 24 diffuses into the active layer 5, during the growth of the current spreading layer composed of n-type $GaAs_{1-a}P_a$ by a HVPE process.

Although the conventional LPE process tends to cause compositional variation in the current spreading layer 7 composed of GaAsP within a single production lot or over the plurality of production lots, adoption of a HVPE process such as in the invention is beneficial in suppressing by far such compositional variation as compared with a LPE process.

Figure 7:
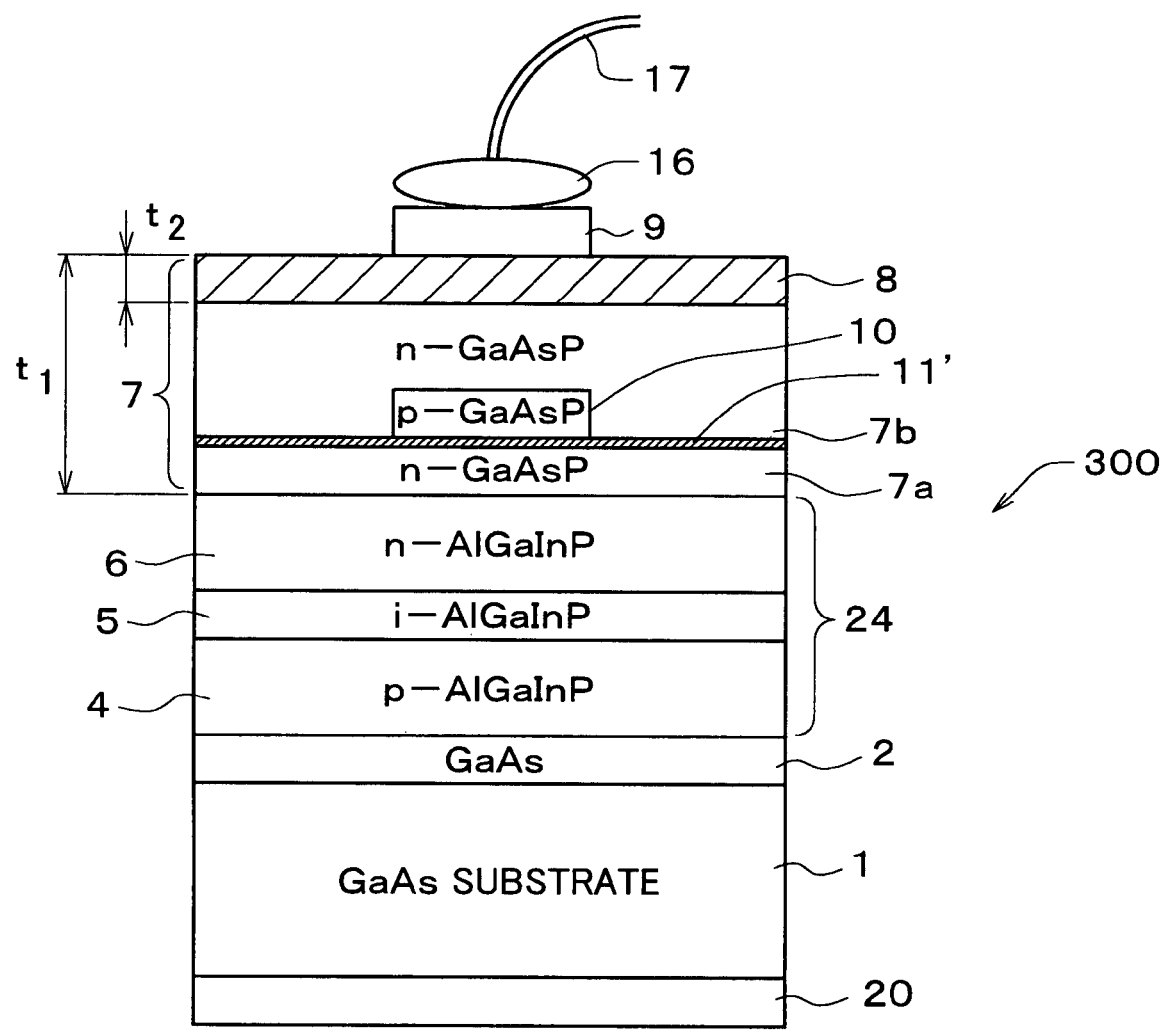
FIG. 7 is a schematic view of a second modified example of the light emitting device shown in FIG. 1.

It is also allowable to leave the fourth layer 11' unetched if the thickness thereof is as small as 1 nm to 50 nm, and as exemplified by light emitting device 300 shown in FIG. 7, the third layer 7b can be formed without removing the portion of the fourth layer 11' exposed out from the current blocking layer 10 (the second layer). In this case, the fourth layer 11' resides between the first layer 7a and the third layer 7b also in the outside area around the current blocking layer 10. Formation of such extremely thin fourth layer 11' successfully reduces influences of discontinuous energy bands, and ensures current supply to the light emitting layer portion 24 without any problem. It is of course advantageous in simplifying the fabrication process since etching of the fourth layer 11' is omissible.

Figure 8:
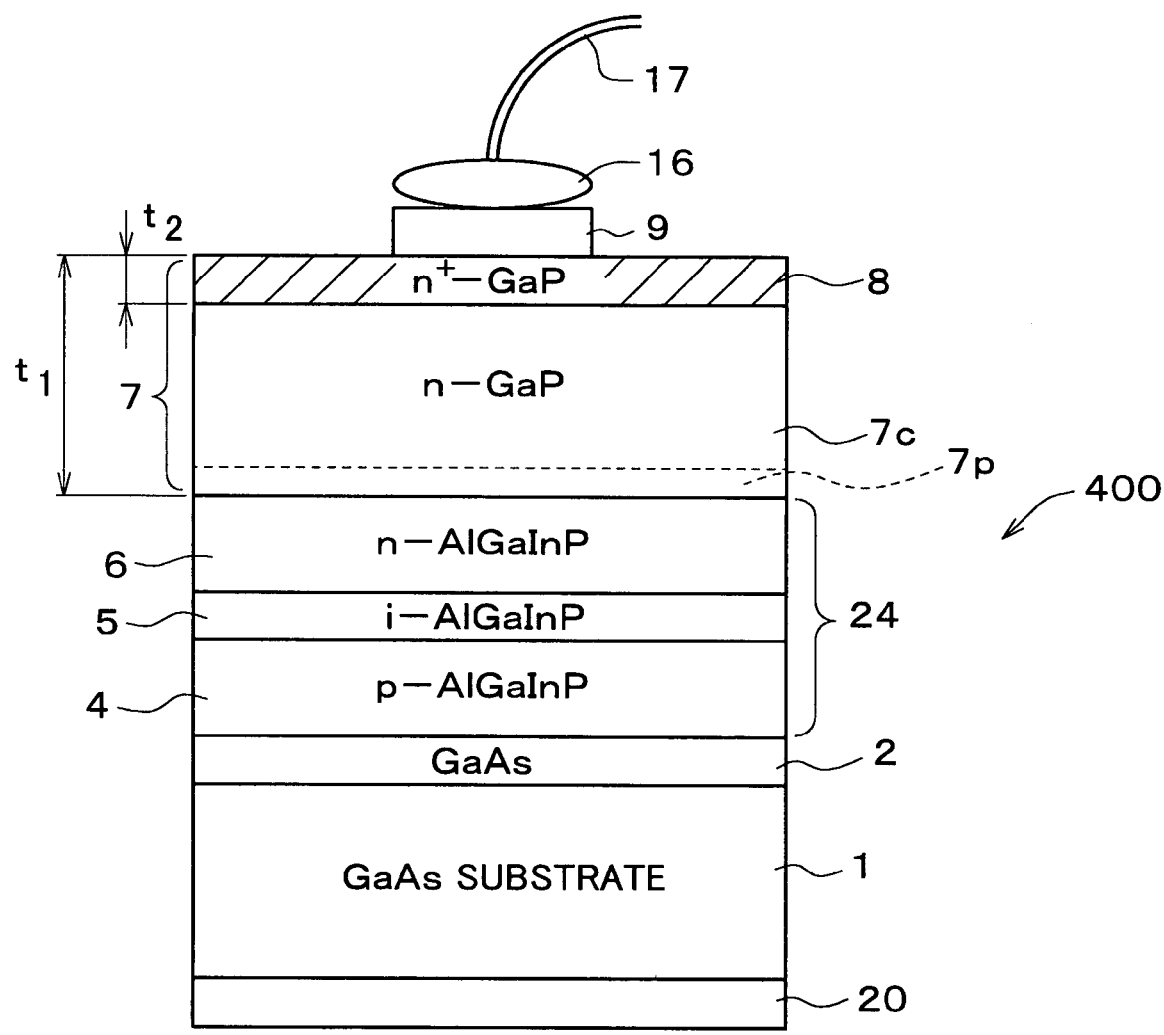
FIG. 8 is a schematic view of a third modified example of the light emitting device shown in FIG. 1.

A light emitting device 400 shown in FIG. 8 has a constitution from which the current blocking layer is omitted. Also in this case, it is preferable to form a portion 7p of the current spreading layer 7 in contact with the light emitting layer portion 24 with an MO layer portion formed by a MOVPE process, and to form the residual portion of the current spreading layer 7 with an HVPE layer portion formed by a HVPE process.

Figure 9:
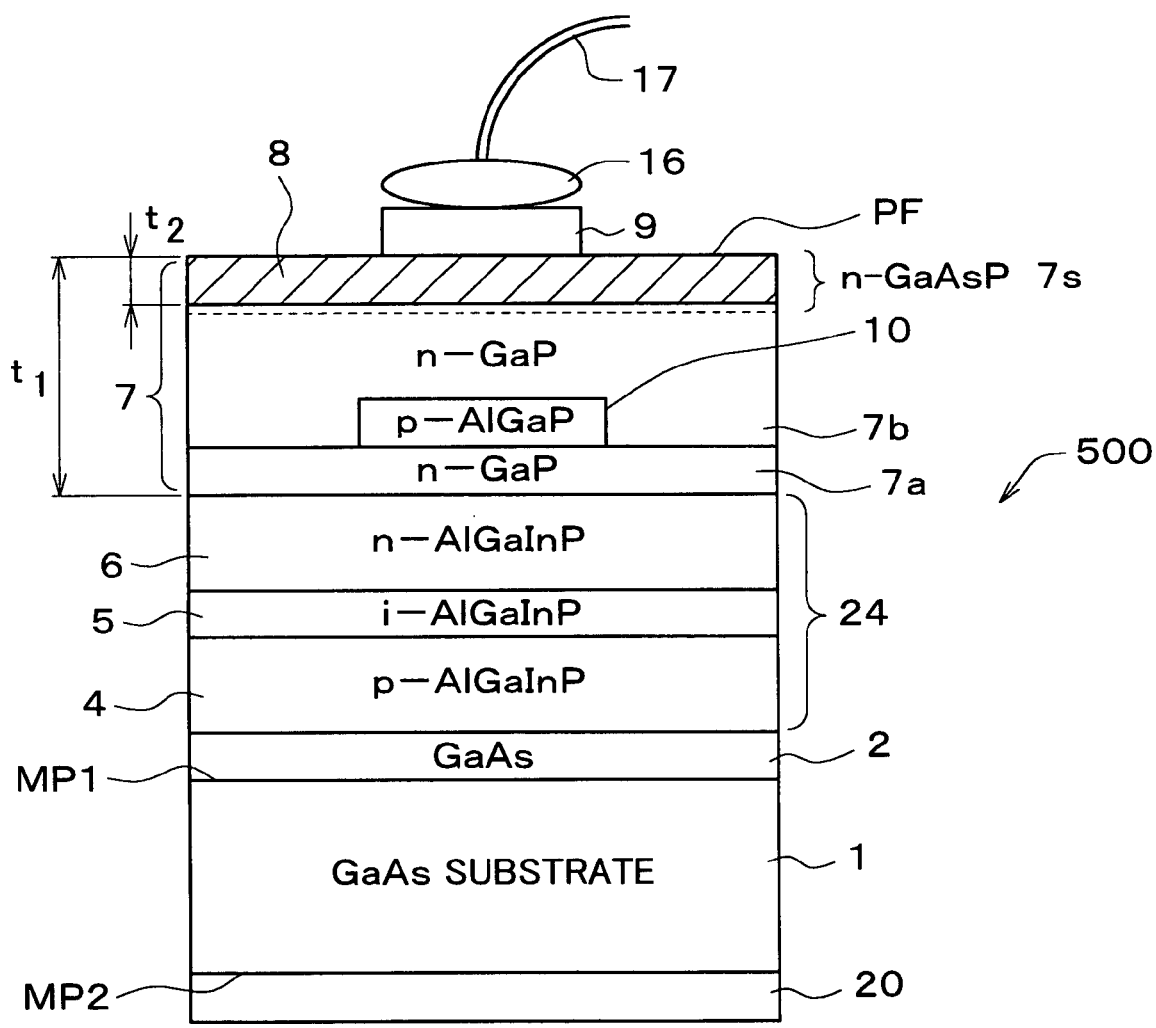
FIG. 9 is a schematic view of a fourth modified example of the light emitting device shown in FIG. 1.

A light emitting device 500 shown in FIG. 9 has a current spreading layer 7, in which the essential portion of which is composed of n-type GaP, only an electrode forming area in the current spreading layer of which is composed of an n-type GaAsP layer 7s, and has the high-concentration doped layer 8 containing one or more selected from the group consisting of Si, S, Se and Te as a dopant formed in such GaAsP layer 7s. An advantage is that composition of the current spreading layer 7 can readily be changed (GaP to GaAsP, herein) in the midway of the growth by a HVPE process by altering mixing ratio of the Group V element gas ($AsH_3$ and $PH_3$).

While the active layer 5 in all of the aforementioned embodiments was formed by a single layer, it is also allowable to form the active layer 5 with a stack of a plurality of compound semiconductor layers differing in the band gap energy, more specifically, with a quantum well structure. The active layer having a quantum well structure is obtained by stacking two layers having the alloy composition controlled to have different band gap energies, which are a well layer having a smaller band gap energy and a barrier layer having a larger band gap energy, and individually having a thickness equals to or smaller than the mean free path of electron (generally monoatomic layer to several nanometers), so as to establish a lattice matching. For the case where the invention is applied, for example, to semiconductor laser devices, the above-described structure allows arbitrary adjustment of oscillation wavelength depending on the width or depth of the energy well layer because the energy of electrons (or holes) within the quantum well layer in such structure are quantized, and the structure is also advantageous in raising the emission efficiency, and in reducing the oscillation threshold current density. Mismatching of the lattice constants up to as much as 2 to 3% or around may be allowable between the well layer and barrier layer since these layers are extremely thin, and thus the oscillation wavelength can readily be expanded. The quantum well structure may be a multiple quantum well structure having a plurality of well layers, or may be a single quantum well structure having only one well layer. The thickness of the barrier layer may be 50 nm or around only for that in contact with the cladding layer, and may be 6 nm or around for the others. The thickness of the well layer may be 5 nm or around.

While the light emitting layer 24 in the above embodiments was formed on the substrate 1 while placing the buffer layer 2 in between, it is also allowable to dispose a reflective layer for raising the light extraction efficiency. The reflective layer may be such as stacking a plurality of semiconductor layers having different refractive indices, as disclosed in Japanese Laid-Open Patent Publication No. 7-66455 (U.S. Pat. No. 5,442,203).

Figure 11:
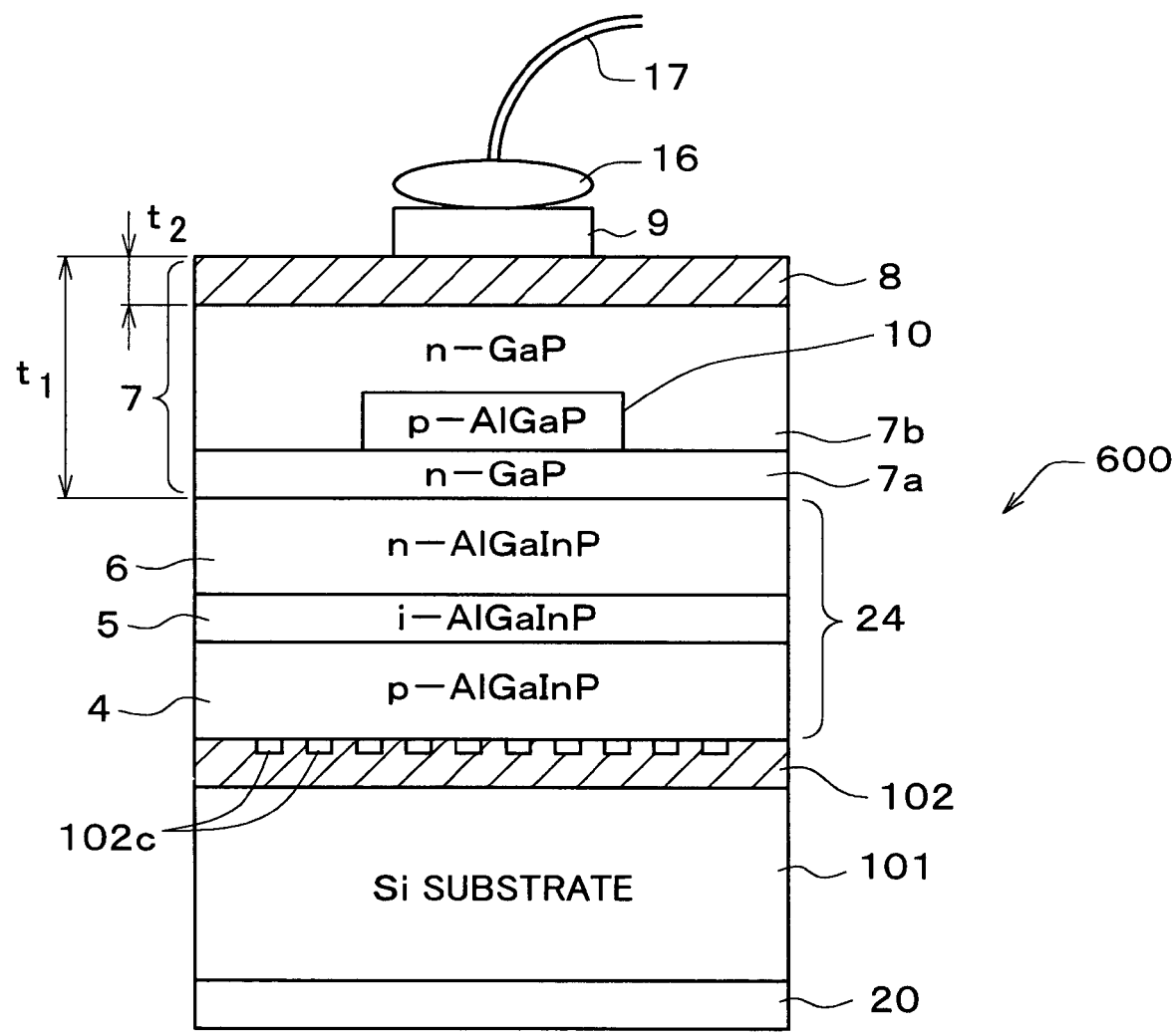
FIG. 11 is a schematic view of a fifth modified example of the light emitting device shown in FIG. 1.
Figure 12:
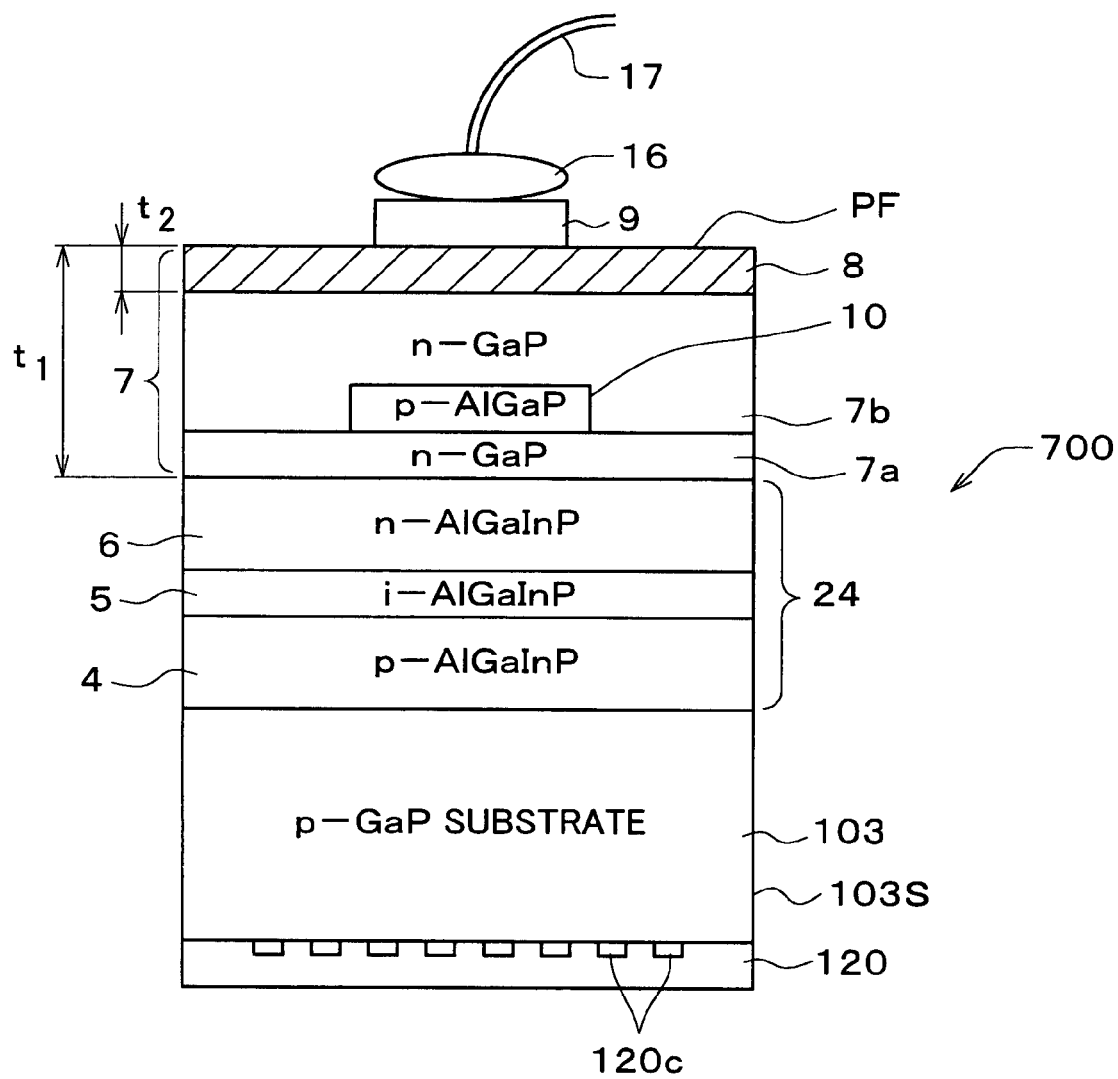
FIG. 12 is a schematic view of a sixth modified example of the light emitting device shown in FIG. 1.

A light emitting device 600 shown in FIG. 11 is configured so that the GaAs single crystal substrate 1 of the light emitting device 100 shown in FIG. 1 is removed typically by etching, and instead an Si substrate 101 which is a conductive substrate (use of a metal plate such as an Al plate also allowable) is bonded while placing a metal layer 102 (typically comprising an Au layer or Ag layer) in between. Between the metal layer 102 and the light emitting layer portion 24, a contact layer 102c is formed in a discrete manner (it is an AuBe layer in this embodiment). Particularly large reflective effect by virtue of the metal layer 102 can be obtained in the area having no contact layer 102c formed therein. A light emitting device 700 shown in FIG. 12 is configured so that the GaAs single crystal substrate 1 of the light emitting device 100 shown in FIG. 1 is removed typically by etching, and instead a GaP substrate 103 which is a transparent conductive substrate (p-type in this embodiment) is bonded. Light can be extracted from the side face 103S of the GaP substrate 103. In the embodiment, contact layer 102c is formed in a discrete manner on the back surface of the GaP substrate 103, and the contact layer 102c, together with the area having no contact layer 102c formed therein, is covered with an electrode 120 (an Au electrode, for example) for applying emission drive voltage to the light emitting layer portion 24 (formation of an Ag paste layer in place of the electrode 120 also allowable). The current spreading layer 7 also can be composed of GaAsP in both light emitting devices 600 and 700 shown respectively in FIG. 11 and FIG. 12.

Figure 13:
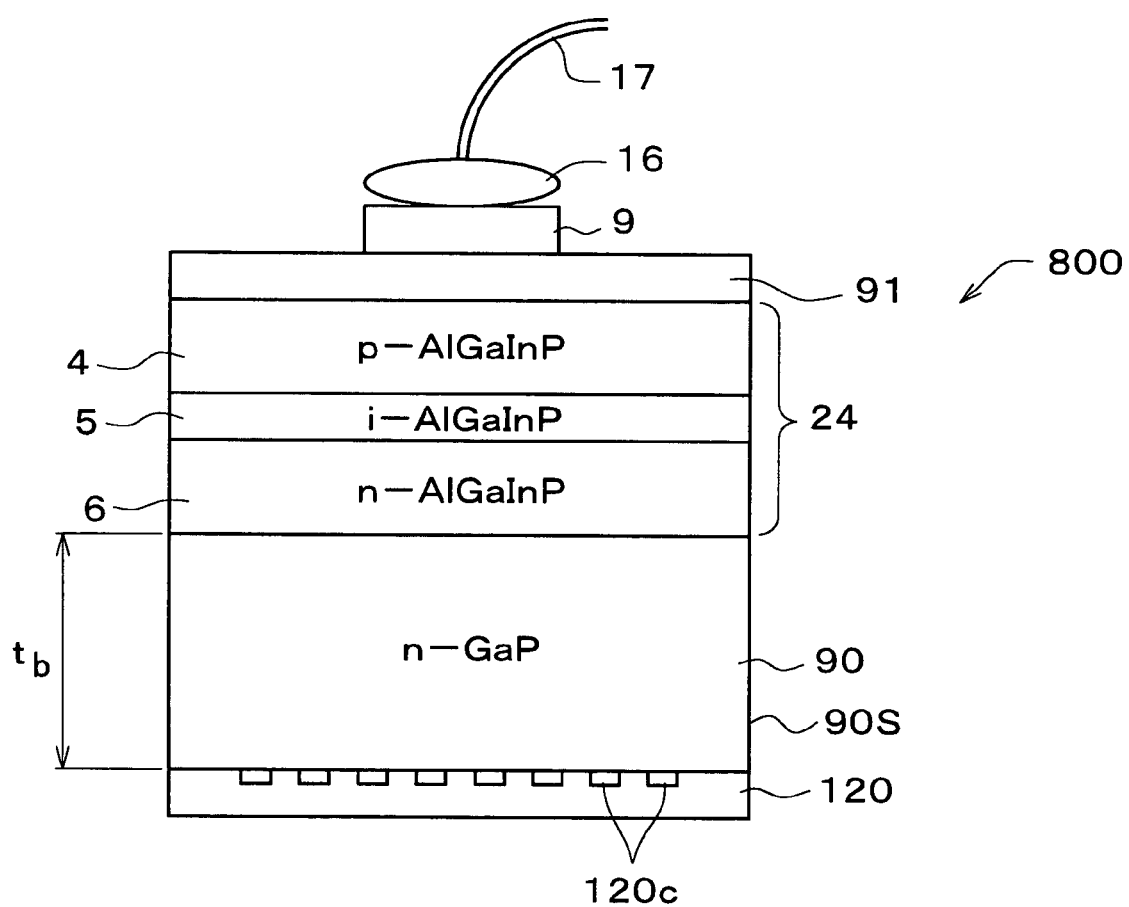
FIG. 13 is a schematic view of a seventh modified example of the light emitting device shown in FIG. 1.

A light emitting device 800 shown in FIG. 13 is configured so that a thick current spreading layer 90 also serves as the substrate for the device is grown on the back surface of the light emitting layer portion 24 (order of stacking of the p-type cladding layer 4, the active layer 5 and the n-type cladding layer 6 is inverted). The current spreading layer 90 herein is an n-type GaP layer epitaxially grown by a HVPE process, where the thickness $t_b$ thereof falls within a range from 50 m to 200 m (100 m, for example). GaP is transparent to the flux of light emitted from the light emitting layer portion 24, and thus the light can be extracted also from the side face 90s thereof. In the embodiment, a transparent contact-forming conductive layer 91 is formed on the light-extraction side (p-type cladding layer 4 side) of the light emitting layer portion 24, and on such contact-forming conductive layer 91, the electrode 9 and the bonding pad 16 are formed. The contact-forming conductive layer 91 is typically composed of GaP, GaAsP, AlGaAs, AlGaInP and so forth, where it is also allowable to use conductive oxides.

In a typical fabrication process of the light emitting device 800 shown in FIG. 13, after completion of step 2 in FIG. 2B, the current spreading layer 90 can be formed directly on the main surface of the light emitting layer portion 24 on the side opposite to the GaAs substrate 1 (n-type cladding layer 6 side) by a HVPE process. The GaAs substrate 1 is then removed, and the contact-forming conductive layer 91 can be formed on the main surface of the light emitting layer portion 24 on the side from which the substrate 1 has been removed (p-type cladding layer 4 side) by epitaxial growth according to a HVPE process (typically for the case where the contact-forming conductive layer 91 is composed of GaP or GaAsP). On the other hand, it is also allowable, for the case where the contact-forming conductive layer 91 is composed of AlGaAs or AlGAInP, that the contact-forming conductive layer 91 is first grown on the GaAs substrate 1 by a MOVPE process, the light emitting layer portion 24 is grown, and the GaAs substrate 1 is then removed. The contact-forming conductive layer 91 composed of AlGaInP may have the same alloy composition as that of the AlGaInP composing the cladding layer on the light emitting layer portion side (p-type cladding layer 4 side in FIG. 13), or may have a different alloy composition. When the same alloy composition is selected, it is preferable to raise the dopant concentration of the contact-forming conductive layer 91 as compared with that of the cladding layer, so as to raise the conductivity. When a different alloy composition is selected, it is preferable to set the alloy composition so as to expand the band gap as compared with that of the active layer 5 of the light emitting layer portion 24, in view of raising the translucence.

In the light emitting device 700 shown in FIG. 12 and the light emitting device 800 shown in FIG. 13, the contact layer 120c (an AuBe layer in contact with the p-type GaP substrate 103 in FIG. 12, and an AuGeNi layer in contact with the current spreading layer 90 comprising n-type GaP in FIG. 13) is formed in a discrete manner on the back surface of the GaP substrate 103 or current spreading layer 90. In this embodiment, the contact layer 120c, together with the area having no contact layer 120c formed therein, is covered with the electrode 120 (an Au electrode, for example) for applying emission drive voltage to the light emitting layer portion 24 (formation of an Ag paste layer in place of the electrode 120 also allowable). According to the constitution, the reflective effect by the metal electrode can be raised in the area having no contact layer 120c formed therein.

Effects of use of the largely-off-angled substrate were confirmed by the experiments below. On the substrate before dicing, the individual layers for composing the light emitting device shown in FIG. 1 were formed so as to have thickness listed below. The GaAs single crystal substrates used herein were such as having the major axes tilted by various angles within a range from 2° to 20° with respect to the <100> direction.

n-type AlGaInP cladding layer 6: 1 m (Si doping concentration: $1 \times 10^{17}$ to $3 \times 10^{17}/cm^3$);
AlGaInP active layer 5: 0.6 m (emission wavelength: 650 nm), (non-doped);
p-type AlGaInP cladding layer 4: 1 m (Mg doping concentration: $4 \times 10^{17}$ to $10 \times 10^{17}/cm^3$);
current spreading layer 7: 5 to 50 m; and
current blocking layer 10: 0.1 m.

The thickness of the current spreading layer 7 formed by a HVPE process was set to various values within a range from 5 m to 50 m, and the growth temperature was set to various values within a range from 640° C. to 840° C. The obtained substrate was observed for the surface of the current spreading layer 7 under an optical microscope, and the number per unit area of coarse projection-like crystal defects having a planar outer diameter of 20 m or more was counted and summarized in Table 1 below (conditions for the judgment are given in the footnote of Table 1).

TABLE 1

| Angle of tilt | Growth temperature (° C.) | | | | |
|---|---|---|---|---|---|
| (°) | 840 | 790 | 740 | 690 | 640 |
| 2 | ◎ | ○ | X | X | X |
| 5 | ◎ | ◎ | ○ | Δ | X |
| 10 | ◎ | ◎ | ◎ | ○ | Δ |
| 15 | ◎ | ◎ | ◎ | ◎ | Δ |
| 20 | ◎ | ◎ | ◎ | ○ | Δ |

Count of projection-like crystal defects
◎: less than $3/cm^2$;
○: $3/cm^2$ or more and less than $10/cm^2$;
Δ: $10/cm^2$ or more and less than $20/cm^2$; and
x: $20/cm^2$ or more.

Figure 10:
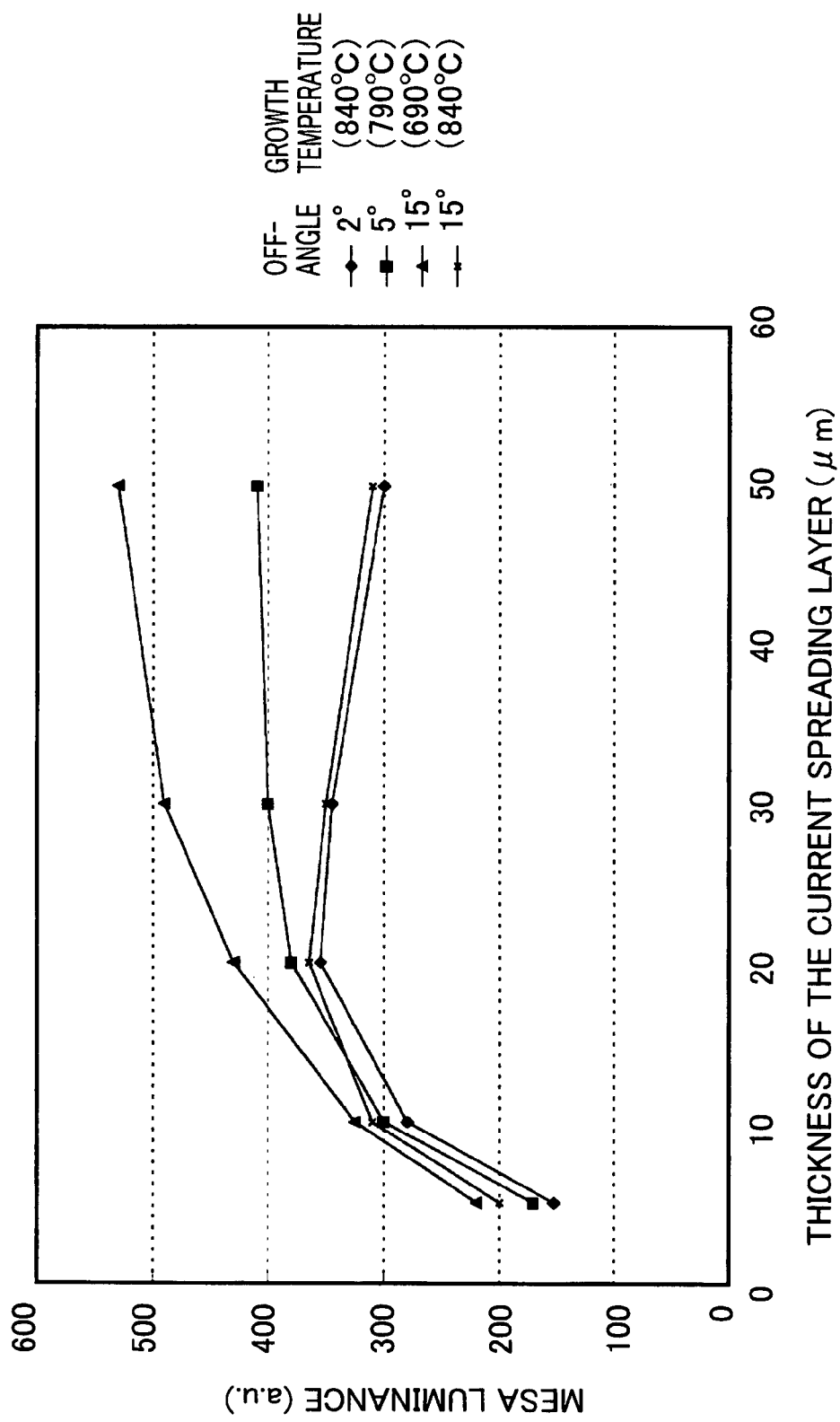
FIG. 10 is a graph showing results of measurement of relation between mesa luminance and thickness of the current spreading layer under various off-angled conditions of GaAs single crystal substrate.

It is known from the above results that angle of tilt within 10° to 20° was successful in distinctively reducing the number of generated projection-like crystal defects on the surface of the current spreading layer 7 even when the growth temperature of the current spreading layer 7 was set to relatively as low as 790° C. or below, and in obtaining a smooth and desirable surface. In particular for the case where the angle of tilt was set to 15°, which fell within a range from 13° to 17°, it was found that the suppressive effect against generation of the projection-like crystal defects was not largely ruined even if the growth temperature of the current spreading layer 7 was lowered to as low as 690° C. to 640° C. FIG. 10 is a graph showing measured results of the mesa luminance (see Japanese Laid-Open Patent Publication No. 51-144185) of the light emitting layer portion 24 when the GaP current spreading layer 7 was grown under various off-angled conditions at the lowermost temperatures allowing the surface status of the current spreading layer to be optimized, by a HVPE process so as to have various thickness. The mesa luminance generally increased with increase in the thickness of the current spreading layer 7 because the current was more likely to spread within the plane, and was uniformly supplied to the light emitting layer portion 24. The current spreading layer having a certain level of thickness, however, resulted in increased duration of time during which the light emitting layer portion 24 was exposed to thermal history during the growth of the current spreading layer, so that degradation of the dopant profile due to diffusion proceeded so as to decelerate increasing tendency of the mesa luminance. Referring now to FIG. 10, under an off-angled condition of 15°, the lowermost temperature allowing the surface status of the current spreading layer 7 to be optimized was 690° C., and this was found to be lower by as much as 150° C. than the lowermost temperature of 840° C. under an off-angled condition of 2°, as obvious from Table 1. As a consequence, the rate of increase in the mesa luminance relative to the thickness of the current spreading layer 7 did not fall so sharply, and it was found in particular for the case where the current spreading layer 7 had a thickness of 25 m or above, that a relative mesa luminance increased by as much as 10 to 40% or around as compared with the case under an off-angled condition of 2°. FIG. 10 also shows a comparative case in which the growth temperature was set to 890° C. under an off-angled condition of 15°, where it was found that rate of increase in the mesa luminance relative to the thickness of the current spreading layer fell to a considerable degree. It was thus found that the reason why a desirable result was obtained at a growth temperature of 690° C. under an off-angled condition of 15° was that the lowering of the growth temperature successfully prevented the dopant profile from being degraded due to diffusion.

What is claimed is:

1. A light emitting device having a light emitting layer portion and a current spreading layer, respectively composed of a Group III-V compound semiconductor, formed on a single substrate, wherein:
    the light emitting layer portion is formed by a metal organic vapor-phase epitaxy process; and
    the current spreading layer, on the light emitting layer portion, is composed of GaP formed as an n-type semiconductor layer by a hydride vapor-phase epitaxy process which is different from the metal organic vapor-phase epitaxy process;
    herein the current spreading layer and a portion of the light emitting layer portion in contact with the current spreading layer are composed of Group III-V compound semiconductors differing from each other in the lattice constants, and the current spreading layer has an MO layer portion formed by a metal organic vapor-phase epitaxy process in a portion in contact with the light emitting layer portion, and has an HVPE layer portion formed by a hydride vapor-phase epitaxy process in a residual portion; and
    wherein a high-concentration doped layer is formed in a surficial area including the main surface on the electrode forming side of the current spreading layer, so as to have a carrier concentration of one or more selected from the group consisting of Si, S, Se and Te as the dopant higher than that in the residual portion of the current spreading layer.

2. The light emitting device as claimed in claim 1, wherein the current spreading layer is formed, using one or more selected from the group consisting of Si, S, Se and Te as the dopant, as an n-type semiconductor layer, and the carrier concentration of the dopant is adjusted within a range from $1 \times 10^{18}/cm^3$ to $5 \times 10^{19}/cm^3$ for the high-concentration doped layer, and from $1 \times 10^{17}/cm^3$ $1 \times 10^{18}/cm^3$ for the residual portion.

3. A light emitting device having a light emitting layer portion and a current spreading layer, respectively composed of a Group III-V compound semiconductor, once formed on a single crystal substrate by epitaxial growth, wherein:
    the light emitting layer portion is formed by a metal organic vapor-phase epitaxy process; and
    the current spreading layer, on the light emitting layer portion, is formed as an n-type semiconductor layer by a hydride vapor-phase epitaxy process which is different from the metal organic vapor-phase epitaxy process;
    herein the current spreading layer and a portion of the light emitting layer portion in contact with the current spreading layer are composed of Group III-V compound semiconductors differing from each other in the lattice constants, and the current spreading layer has an MO layer portion formed by a metal organic vapor-phase epitaxy process in a portion in contact with the light emitting layer portion, and has an HVPE layer portion formed by a hydride vapor-phase epitaxy process in a residual portion;
    wherein a high-concentration doped layer is formed in a surficial area including the main surface on the electrode forming side of the current spreading layer, so as to have a carrier concentration of one or more selected from the group consisting of Si, S, Se and Te as the dopant higher than that in the residual portion of the current spreading layer; and
    wherein the current spreading layer is designed to have a portion on the electrode forming side a high-GaAs-alloy-composition $GaAs_{1-a}P_a$ ($0 \leq a < 1$) layer having a GaAs alloy composition 1−a larger than that in the residual portion, and to have a high-concentration doped layer, containing one or more selected from the group consisting of Si, S, Se and Te as the dopant, formed in the high-GaAs-alloy-composition $GaAs_{1-a}P_a$ layer.

4. A light emitting device having a light emitting layer portion and a current spreading layer, respectively composed of a Group III-V compound semiconductor, once formed on a single crystal substrate by epitaxial growth, wherein:
    the light emitting layer portion is formed by a metal organic vapor-phase epitaxy process; and
    the current spreading layer, on the light emitting layer portion, is formed as an n-type semiconductor layer by a hydride vapor-phase epitaxy process which is different from the metal organic vapor-phase epitaxy process;
    herein the current spreading layer and a portion of the light emitting layer portion in contact with the current spreading layer are composed of Group III-V compound semiconductors differing from each other in the lattice constants, and the current spreading layer has an MO layer portion formed by a metal organic vapor-phase epitaxy process in a portion in contact with the light emitting layer portion, and has an HVPE layer portion formed by a hydride vapor-phase epitaxy process in a residual portion;
    wherein the current spreading layer is formed, using one or more selected from the group consisting of Si, S, Se and Te as the dopant, as an n-type semiconductor layer, and the carrier concentration of the dopant is adjusted within a range from $1\times10^{18}/cm^3$ to $5\times10^{19}/cm^3$ for the high-concentration doped layer, and from $1\times10^{17}/cm^3$ $1\times10^{18}/cm^3$ for the residual portion; and wherein a high-concentration doped layer is formed in a surficial area including the main surface on the electrode forming side of the current spreading layer, so as to have a carrier concentration of one or more selected from the group consisting of Si, S, Se and Te as the dopant higher than that in the residual portion of the current spreading layer, wherein the current spreading layer is designed to have a portion on the electrode forming side a high-GaAs-alloy-composition $GaAs_{1-a}P_a$ ($0 \leq a < 1$) layer having a GaAs alloy composition 1−a larger than that in the residual portion, and to have a high-concentration doped layer, containing one or more selected from the group consisting of Si, S, Se and Te as the dopant, formed in the high-GaAs-alloy-composition $GaAs_{1-a}P_a$ layer.

* * * * *